United States Patent
Hojo

(10) Patent No.: US 9,394,415 B2
(45) Date of Patent: Jul. 19, 2016

(54) LONG OBLIQUELY-STRETCHED FILM, AND CIRCULARLY POLARISING PLATE AND ORGANIC EL DISPLAY USING LONG OBLIQUELY-STRETCHED FILM

(71) Applicant: Konica Minolta, Inc., Tokyo (JP)

(72) Inventor: Daisuke Hojo, Kobe (JP)

(73) Assignee: Konica Minolta, Inc., Tokyo (JP)

( * ) Notice: Subject to any disclaimer, the term of this patent is extended or adjusted under 35 U.S.C. 154(b) by 0 days.

(21) Appl. No.: 14/441,147

(22) PCT Filed: Nov. 6, 2012

(86) PCT No.: PCT/JP2012/007116
§ 371 (c)(1),
(2) Date: May 6, 2015

(87) PCT Pub. No.: WO2014/073020
PCT Pub. Date: May 15, 2014

(65) Prior Publication Data
US 2015/0284522 A1 Oct. 8, 2015

(51) Int. Cl.
*G02B 5/30* (2006.01)
*C08J 5/18* (2006.01)
*B29C 55/04* (2006.01)
(Continued)

(52) U.S. Cl.
CPC ............... *C08J 5/18* (2013.01); *B29C 55/045* (2013.01); *B29D 11/00644* (2013.01); *G02B 5/305* (2013.01); *G02B 5/3033* (2013.01); *G02B 5/3083* (2013.01); *B29K 2995/0034* (2013.01);
(Continued)

(58) Field of Classification Search
CPC ...... G02B 5/3083; G02B 1/04; G02B 5/3033; G02B 5/305; G02B 27/28; B29K 2995/0034; H01L 2224/16225; H01L 51/5281; B32B 2307/42
USPC ............. 359/483.01, 486.01, 486.02, 489.01, 359/489.06, 492.01; 264/1.34, 1.35, 479, 264/291
See application file for complete search history.

(56) References Cited

U.S. PATENT DOCUMENTS 6,511,756 B1  1/2003 Obuchi et al.
6,565,974 B1  5/2003 Uchiyama et al.
(Continued)

FOREIGN PATENT DOCUMENTS

EP  0 911 656 A2  4/1999
JP  H05-97978 A   4/1993
(Continued)

OTHER PUBLICATIONS

International Search Report issued in PCT/JP2012/007116 mailed on Jan. 29, 2013 (1 page).
(Continued)

*Primary Examiner* — Scott J Sugarman
*Assistant Examiner* — Daniele Manikeu
(74) *Attorney, Agent, or Firm* — Osha Liang LLP

(57) ABSTRACT

A long obliquely-stretched film wound into a roll shape includes a thermoplastic resin and has an orientation angle oriented in a direction inclined with respect to a widthwise direction thereof. In a longitudinal direction of the long obliquely-stretched film, an angle defined between the orientation angle and the widthwise direction has a longitudinal cycle length of 10 mm to less than 1500 mm. An amplitude of the angle is in the range of 0.2° to 1.0° in the longitudinal cycle length.

8 Claims, 11 Drawing Sheets

(51) Int. Cl.
*B29D 11/00* (2006.01)
*H01L 51/52* (2006.01)

(52) U.S. Cl.
CPC .......... *C08J 2369/00* (2013.01); *H01L 51/5281* (2013.01)

(56) References Cited

U.S. PATENT DOCUMENTS

| | | | |
|---|---|---|---|
| 6,778,242 | B1 | 8/2004 | Murayama et al. |
| RE39,753 | E | 7/2007 | Uchiyama et al. |
| 2004/0233363 | A1 | 11/2004 | Murayama et al. |
| 2005/0233095 | A1 | 10/2005 | Umeda et al. |
| 2006/0062934 | A1 | 3/2006 | Hayashi et al. |
| 2009/0130341 | A1* | 5/2009 | Asada ................... B29C 55/045 428/1.1 |
| 2009/0159857 | A1 | 6/2009 | Uehira et al. |
| 2010/0002170 | A1 | 1/2010 | Itadani et al. |
| 2011/0075258 | A1* | 3/2011 | Mullen ................. G02B 5/3058 359/492.01 |
| 2011/0097546 | A1 | 4/2011 | Itadani et al. |
| 2012/0119169 | A1 | 5/2012 | Kaneko |
| 2012/0308796 | A1 | 12/2012 | Tanaka et al. |
| 2014/0225288 | A1* | 8/2014 | Haida ................... G02B 5/3083 264/1.6 |
| 2014/0268334 | A1 | 9/2014 | Tanaka et al. |

FOREIGN PATENT DOCUMENTS

| | | |
|---|---|---|
| JP | H05-310845 A | 11/1993 |
| JP | H10-45804 A | 2/1998 |
| JP | H11-124429 A | 5/1999 |
| JP | 2003-167121 A | 6/2003 |
| JP | 2004-233604 A | 8/2004 |
| JP | 2005-121813 A | 5/2005 |
| JP | 2005-331915 A | 12/2005 |
| JP | 2006-091836 A | 4/2006 |
| JP | 2006-150659 A | 6/2006 |
| JP | 2006-215465 A | 8/2006 |
| JP | 2006-256064 A | 9/2006 |
| JP | 2008-107767 A | 5/2008 |
| JP | 2009-126128 A | 6/2009 |
| JP | 2010-031223 A | 2/2010 |
| JP | 2011-053645 A | 3/2011 |
| JP | 2012-031369 A | 2/2012 |
| JP | 2012-067300 A | 4/2012 |
| WO | 00/26705 A1 | 5/2000 |
| WO | 2007/061105 A1 | 5/2007 |

OTHER PUBLICATIONS

Written Opinion of the International Searching Authority issued in PCT/JP2012/007116 mailed on Jan. 29, 2013 (3 pages).

* cited by examiner

LONG OBLIQUELY-STRETCHED FILM, AND CIRCULARLY POLARISING PLATE AND ORGANIC EL DISPLAY USING LONG OBLIQUELY-STRETCHED FILM

TECHNICAL FIELD

One or more embodiments of the present invention relate to a long obliquely-stretched film, and a circularly polarising (polarizing) plate and an organic EL display using the long obliquely-stretched film.

BACKGROUND ART

A stretched film formed by stretching a resin is used in various types of display devices, as a variety of optical films each carrying out a desired optical function, by utilizing its optical anisotropy. For example, in the field of liquid crystal display devices, it is known to use the stretched film as an optical compensation film for optical compensation such as prevention of coloration and widening of a viewing angle, and use the stretched film as a retardation film additionally serving as a polarizing-plate protection film, by laminating the stretched film and a polarizer together.

Meanwhile, late years, great interest has been shown in a self-luminous display device such as an organic electroluminescence (EL) display device, as a new display device. A self-luminous display device has a potential to suppress electricity consumption, as compared to a liquid crystal display device in which a backlight is always in an ON state. Further, in a self-luminous display device in which a plurality of light sources, such as organic EL displays, corresponding to respective colors are turned on, individually, there is no need to provide a color filter which becomes a factor of deterioration in contrast, so that it becomes possible to further enhance contract.

In an organic EL display, with a view to enhancing light extraction efficiency, a reflector such as an aluminum plate is provided on the side of a back surface of the display. Thus, outside light entering into the display is reflected by the reflector, thereby causing deterioration in image contrast. In this regard, it is known to use a circularly polarizing plate laminated the above stretched film and a polarizer together on the side of a front surface of the display, as means for preventing the outside-light reflection to thereby enhance light-dark contrast. In some cases, such a circularly polarizing plate is also used in a so-called 3D liquid crystal display device capable of displaying a stereoscopic image.

The lamination for the above circularly polarizing plate needs to be performed under an arrangement in which an in-plane slow axis of the stretched film is inclined at a desired angle with respect to an absorption axis of the polarizer.

However, a commonly-used polarizer (polarizing film) is obtained through stretching performed at a high stretching ratio in a conveyance direction, so that the absorption axis of the polarizer is coincident with the conveyance direction. On the other hand, a conventional retardation film is produced through longitudinal or transverse stretching, so that the in-plane slow axis is oriented in a direction defining an angle of 0° or 90° with respect to a longitudinal direction of the film, in principle. Thus, in order to allow the absorption axis of the polarizer and the slow axis of the stretched film to be arranged in mutually inclined relation with a desired angle therebetween, there is no other way but to perform a batch operation of cutting a long polarizing film and/or a long stretched film into pieces at a specific angle, and laminating respective pieces of the polarizing and stretched films together, so that deterioration in productivity and lowering of product yield due to adhesion of chips are pointed out. Particularly, in a current situation where the organic EL display is being increased in size year by year, the technique of obliquely cutting an obtained stretched film and then laminating the resulting stretched film to a polarizer causes deterioration in film utilization efficiency, thereby deterioration in productivity. Thus, there is a need to improve the productivity.

In regard to this need, there have been proposed various long stretched film production methods designed to stretch a resin film in an oblique direction at a desired angle by using an oblique stretching apparatus, wherein the slow axis can be freely controlled to be oriented in a direction defining an angle which is neither 0° nor 90°, with respect to a widthwise direction of the film (see, for example, the following Patent Literature 1).

In such methods, using a so-called bending type oblique stretching apparatus, a long obliquely-stretched film having a slow axis in a direction defining a desired angle of greater than 0° to less than 90° with respect to a widthwise direction thereof is produced by: feeding a long film from a direction which is different from a film winding direction after stretching; conveying the long film while holding opposite lateral ends of the long film by a pair of grippers; and, when a direction of the conveyance is changed, causing respective moving distances of one of the grippers and the other gripper to become different from each other to thereby obliquely stretch the long film. The use of such a stretched film having a slow axis inclinedly oriented with respect to the widthwise direction makes it possible to produce a circularly polarizing plate by laminating a long polarizing film and the long obliquely-stretched film in a roll-to-roll manner, instead of the conventional batch-wise lamination, thereby drastically enhancing the productivity and significantly improving the product yield.

Further, even in a situation where the long stretched film is used in a large-screen display, the capability of producing a circularly polarizing plate by roll-to-roll lamination makes it possible to increase a utilizable area of the long stretched film, thereby significantly reducing production cost of the circularly polarizing plate.

However, when viewing an image in a black state of an organic EL display equipped with an circularly polarizing plate produced by using the above long obliquely-stretched film, a phenomenon that black is tinged with red or blue, and the hue varies depending on a position on the display, so-called "color unevenness", was observed. It was also found that a level of the color unevenness (optical unevenness) varies depending on a region of the long obliquely-stretched film used when producing the organic EL display, i.e., a visual condition of the display varies depending on the used region.

As a result of studying the above background art, it was found out that, in a self-luminous display device in which a plurality of light sources such as organic EL displays, corresponding to respective colors are turned on, individually, very high contrast is achieved because there are few members such as a color filter which become a factor of deterioration in contrast, whereas color unevenness tends to be significantly observed because even slight variation in optical property causes color unevenness.

It was also found that, when the long obliquely-stretched film is wound into a roll shape and, after being subjected to long-term storage, laminated to a long optical film in a roll-to-roll manner to obtain a circularly polarizing plate, a state of color unevenness is different from that in a circularly polarizing plate obtained using the long obliquely-stretched film without the long-term storage. That is, it was found that the state of color unevenness in a circularly polarizing plate obtained using the long obliquely-stretched film becomes different depending on a length of the storage period of the roll-shaped long obliquely-stretched film.

As a result of further studying these background art, it was found that, in the long obliquely-stretched film produced using the above conventional bending type oblique stretching apparatus, winding displacement is more likely to occur when it wound into a roll shape after oblique stretching. It was considered that this is primarily because an orientation angle of elastic modulus is oriented in an oblique direction during oblique stretching of a long film, so that a winding tension is not uniformly imparted to the resulting long obliquely-stretched film in a widthwise direction thereof during winding.

Then, the inventor of this application corrected the winding displacement by adjusting a condition of tension during winding, and others. However, a distribution of strong and weak regions in terms of winding tightness was produced, resulting in occurrence of deformation (including sticking between contact regions of the film and formation of a concavity on a surface of the film) during long-term storage of the roll-shaped wound body. As a result, in an organic EL display equipped with a λ/4 plate obtained by laminating a polarizer and the long obliquely-stretched film after long-term storage together, the above color unevenness was not achieved.

The inventor also focused on a cyclicity of the orientation angle described in the following Patent Literature 2. However, the technique described in the Patent Literature 2 could not sufficiently improve the deformation of the roll-shaped wound body during long-term storage due to the distribution of strong and weak regions in terms of winding tightness.

CITATION LIST

Patent Literature

Patent Literature 1: WO 2007/061105 A
Patent Literature 2: JP 2005-331915 A

SUMMARY OF THE INVENTION

One or more embodiments of the present invention provide a long obliquely-stretched film capable of suppressing the occurrence of winding displacement during winding in a situation where it is produced using a bending type oblique stretching apparatus, and suppressing the occurrence of deformation of an obtained roll-shaped wound body during long-term storage, and a circularly polarizing plate and an organic EL display using the long obliquely-stretched film. Accordingly, one or more embodiments of the present invention provide a long obliquely-stretched film capable of suppressing the occurrence of color unevenness even when it is used in a circularly polarizing plate for use in an extremely high-contrast image display device such as an organic EL display, and a circularly polarizing plate and an organic EL display using the long obliquely-stretched film.

According to one or more aspects of the present invention, there is provided a long obliquely-stretched film wound into a roll shape. The long obliquely-stretched film comprises a thermoplastic resin and having an orientation angle oriented in a direction inclined with respect to a widthwise direction thereof, wherein, in a longitudinal direction of the long obliquely-stretched film, an angle defined between the orientation direction of the orientation angle and the widthwise direction has a longitudinal cycle length of 10 mm to less than 1500 mm, and wherein an amplitude of the angle is in the range of 0.2° to 1.0° in the longitudinal cycle length. In this specification, in determination as to whether the angle defined between the orientation direction of the orientation angle and the widthwise direction has the above "longitudinal cycle length", the orientation angle is set by referring to a value at a middle point in the widthwise direction of the film.

These and other features and advantages of one or more embodiments of the present invention will become apparent upon reading of the following detailed description along with the accompanying drawings.

DETAILED DESCRIPTION OF THE INVENTION

Figure 1:
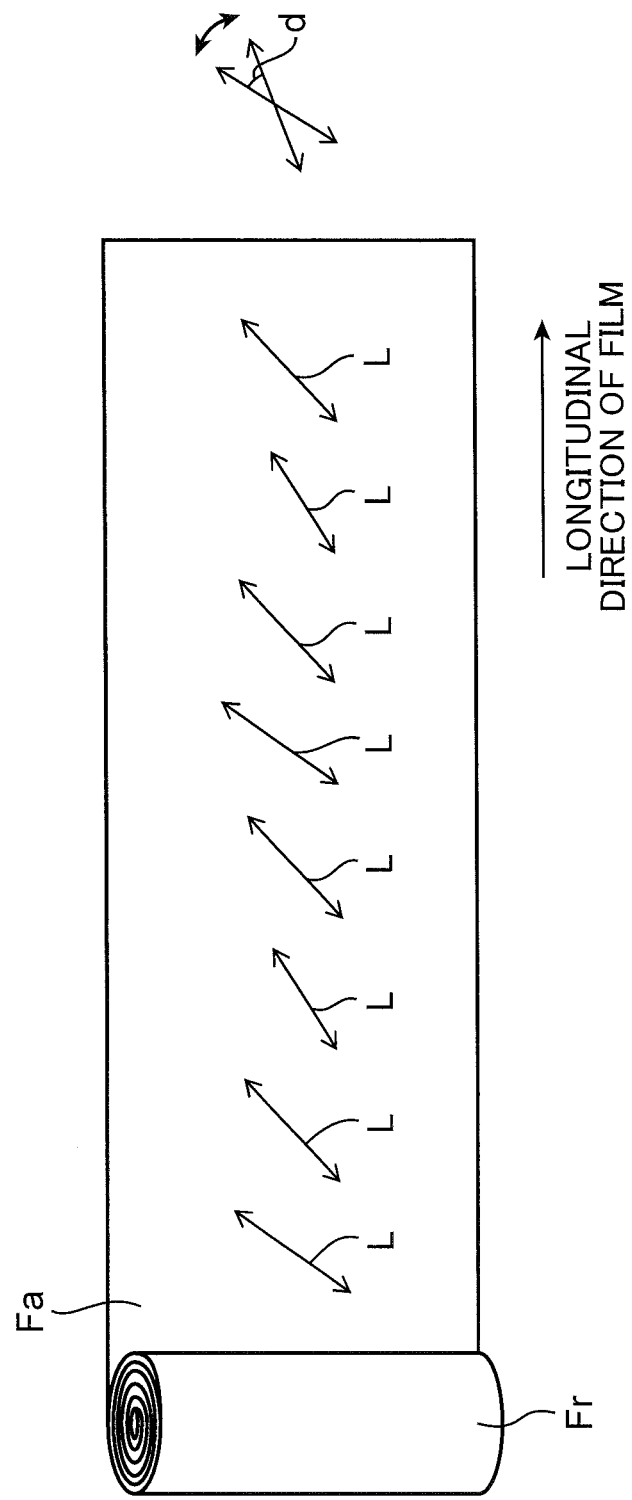
FIG. 1 is a schematic diagram illustrating a direction of an orientation angle formed in a longitudinal direction of a long obliquely-stretched film according to one or more embodiments of the present invention.

Although one or more embodiments of the present invention will now be described in detail based on an embodiment thereof, it is to be understood that the present invention is not limited thereto.

As a result of detailed check on a cause for the optical unevenness occurring in a produced organic EL display or the like, the inventor found that it becomes possible to suppress the occurrence of winding displacement during winding and relieve deformation of a wound body during long-term storage, by forming an orientation angle whose amplitude cyclically changes along a longitudinal direction of a long obliquely-stretched film. Then, the inventor continued the study, and has finally accomplished one or more embodiments of the present invention based on obtained findings.

Specifically, according to one or more aspects of the present invention, there is provided a long obliquely-stretched film wound into a roll shape, which comprises a thermoplastic resin and having an orientation angle oriented in a direction inclined with respect to a widthwise direction thereof, wherein, in a longitudinal direction of the long obliquely-stretched film, an angle defined between the orientation direction of the orientation angle and the widthwise direction has a longitudinal cycle length of 10 mm to less than 1500 mm, and wherein an amplitude of the angle is in the range of 0.2° to 1.0° in the longitudinal cycle length.

Based on the above feature, one or more embodiments of the present invention can provide a long obliquely-stretched film capable of suppressing the occurrence of winding displacement during winding in a situation where it is produced using a bending type oblique stretching apparatus, and suppressing the occurrence of deformation of an obtained roll-shaped wound body during long-term storage. Even in the case where this long obliquely-stretched film is used in a circularly polarizing plate for use in an extremely high-contrast image display device such as an organic EL display, it is possible to suppress the occurrence of color unevenness.

As used in this specification, the term "long" means that a length of a film is at least about five times, preferably, ten times or more, a width thereof. Specifically, such a long film can have a length enough to be wound into a roll (film roll) and stored or transported.

One or more embodiments of the present invention will be specifically described below while appropriately referring to the drawings.

<Long Obliquely-Stretched Film>

A long obliquely-stretched film according to this embodiment is produced by stretching a long film using a bending type oblique stretching apparatus, and wound into a roll shape. The produced long obliquely-stretched film has an orientation angle defined by a direction inclined in the range of greater than 0° to less than 90° with respect to a winding direction. While a specific value of the orientation angle may be appropriately selected depending on an intended purpose of the film, examples thereof may include 15°, 22.5°, 45°, 67.5° and 75°.

Figure 2:
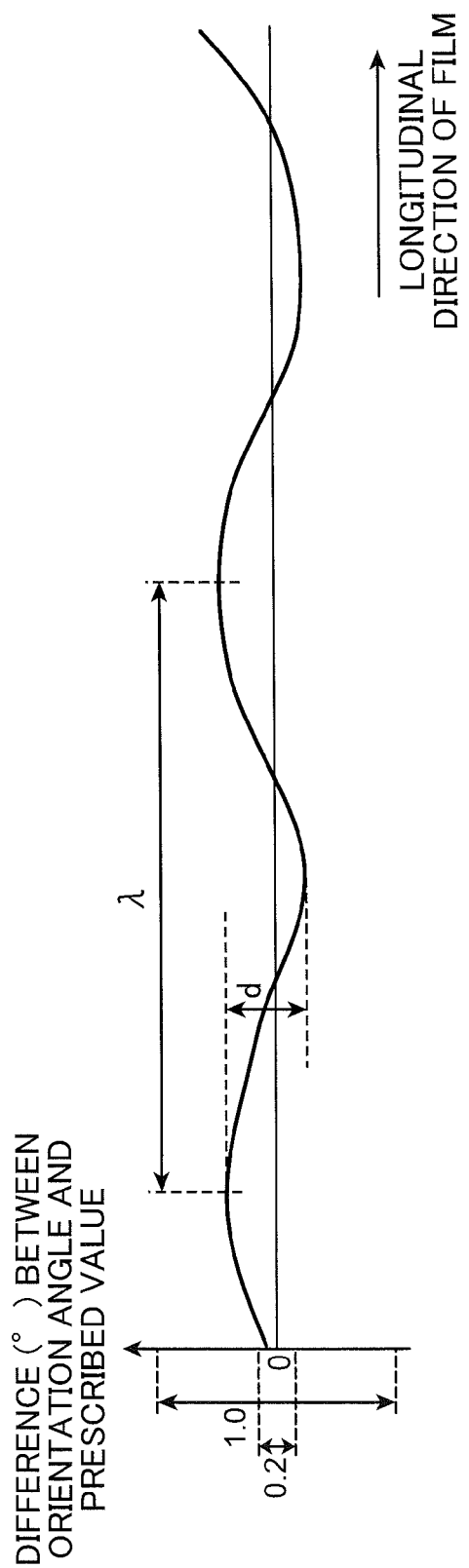
FIG. 2 is a schematic diagram illustrating a distribution of the orientation angle formed in a longitudinal direction of a long obliquely-stretched film according to one or more embodiments of the present invention.

Further, the orientation angle of the long obliquely-stretched film is formed such that an amplitude thereof cyclically changes in a longitudinal direction of the film in the range of 0.2° to 1.0°. FIG. 1 is a schematic diagram illustrating respective directions of orientation angles formed in the longitudinal direction of the film. In FIG. 1, the reference sign Fr indicates a long obliquely-stretched film Fa wound into a roll shape. FIG. 2 is a schematic diagram illustrating a distribution of the orientation angle formed in the longitudinal direction of the film, wherein the horizontal axis represents a position in the longitudinal direction of the film, and the vertical axis represents a difference (°) between each orientation angle and a prescribed value.

As illustrated in FIGS. 1 and 2, a direction of the orientation angle L continuously and cyclically changes along the longitudinal direction of the long obliquely-stretched film Fa (longitudinal cyclical changes). As used in this specification, the term "amplitude" means a deviation angle (absolute value) of a direction of the orientation angle L with respect to a direction of a prescribed orientation angle, as indicated by the reference sign d in FIGS. 1 and 2. The term "prescribed orientation angle" means a target orientation angle of a film to be produced, wherein the deviation angle of the orientation angle L is defined with respect to a direction of this target orientation angle. Further, the term "longitudinal cyclical changes" means cyclical changes of the orientation angle L, in a time period in which the deviation angle of the orientation angle L with respect to the direction of the prescribed orientation angle continuously increases and decreases along the longitudinal direction between a position where it is maximized to a position where it is subsequently maximized again, as illustrated in FIG. 2. In FIG. 2, a cycle length of the cyclical changes is indicated by the reference sign λ. More specifically, on an assumption that the prescribed orientation angle is 45°, and the amplitude d is 0.2°, the orientation direction of the orientation angle L continuously changes in the range of 44.9 to 45.1°. Further, on an assumption that the prescribed orientation angle is 45°, and the amplitude d is 1.0°, the orientation direction of the orientation angle L continuously changes in the range of 44.5 to 45.5°.

In the long obliquely-stretched film according to this embodiment, the amplitude is in the range of 0.2° to 1.0°, preferably, 0.3 to 0.8°, more preferably, 0.5° to 0.7°. The orientation angle is formed such that an amplitude thereof cyclically changes in the longitudinal direction of the film in the range of 0.2° to 1.0°. In this case, when the long obliquely-stretched film is wound into a roll, winging displacement is less likely to occur. In addition, when an obtained wound body is subjected to long-term storage, sticking between contact regions of the film and a concavity of the film are less likely to occur. Therefore, the long obliquely-stretched film according to this embodiment can suppress changes of optical properties during storage, and suppress the occurrence of color unevenness even when it is used in a circularly polarizing plate for use in an extremely high-contrast image display device such as an organic EL display. When the amplitude in the longitudinal direction is less than 0.2°, the above effects tend to be less likely to be ascertained. On the other hand, the amplitude in the longitudinal direction is greater than 1.0°, optical unevenness tends to occur in a produced organic EL display.

The longitudinal cycle length (film length in the longitudinal direction) during cyclical changes in the longitudinal direction of the long obliquely-stretched film according to this embodiment is in the range of 10 mm to less than 1500 mm, preferably, 15 mm to less than 1000 mm, more preferably, 20 mm to less than 500 mm. As long as the cycle length of the longitudinal cyclical changes falls within the above range, winding displacement is less likely to occur when the long obliquely-stretched film is wound into a roll. Thus, when the obtained wound body is subjected to long-term storage, sticking between contact regions of the film and a concavity of the film are less likely to occur. This makes it possible to suppress changes of optical properties during storage, and suppress the occurrence of color unevenness even when used in a circularly polarizing plate for use in an extremely high-contrast image display device such as an organic EL display.

The cycle length λ is not necessarily always constant along the longitudinal direction of the long obliquely-stretched film Fa. That is, in the case where the cycle length λ falls within the range of 10 mm to less than 1500 mm. as mentioned above, the cycle length does not need to be always, for example, 10 mm, but may take different value within the range of 10 mm to less than 1500 mm.

A longitudinal length of the long obliquely-stretched film is not particularly limited. For example, it is preferably set to 1000 m or more. In the long obliquely-stretched film according to this embodiment, the orientation angle is formed such that an amplitude thereof cyclically changes in the longitudinal direction, as mentioned above, so that winding displacement is less likely to occur even in a situation where a wound body is produced by winding a long film having such a long length of 1000 m or more. Thus, when the obtained wound body is subjected to long-term storage, sticking between contact regions of the film and a concavity of the film are less likely to occur. This makes it possible to suppress changes of optical properties during storage, and suppress the occurrence of color unevenness even when used in a circularly polarizing plate for use in an extremely high-contrast image display device such as an organic EL display.

A film thickness of the long obliquely-stretched film is not particularly limited. For example, it is preferably set to 10 to 80 μm, more preferably, 15 to 50 μm, further preferably, 20 to 40 μm. As long as the film thickness falls within this range, the long obliquely-stretched film according to this embodiment not only exhibits excellent mechanical strength but also suppresses winding displacement when it is wound into a roll shape. Thus, when the obtained wound body is subjected to long-term storage, sticking between contact regions of the film and a concavity of the film are less likely to occur. This makes it possible to suppress changes of optical properties during storage, and suppress the occurrence of color unevenness even when used in a circularly polarizing plate for use in an extremely high-contrast image display device such as an organic EL display.

A widthwise length of the long obliquely-stretched film is not particularly limited. For example, it is preferably set to 500 mm or more, more preferably, 1000 to 4000 mm, further preferably, 2000 to 3000 mm. In the long obliquely-stretched film according to this embodiment, the orientation angle is formed such that an amplitude thereof cyclically changes in the longitudinal direction, as mentioned above, so that winding displacement is less likely to occur even in a situation where a wound body is produced by winding a wide film having such a wide length of 500 mm or more. Thus, when the obtained wound body is subjected to long-term storage, sticking between contact regions of the film and a concavity of the film are less likely to occur. This makes it possible to suppress changes of optical properties during storage, and suppress the occurrence of color unevenness even when used in a circularly polarizing plate for use in an extremely high-contrast image display device such as an organic EL display.

Preferably, the long obliquely-stretched film according to this embodiment is produced using a long film having a photo-elastic coefficient adjusted to fall within the range of $1.0 \times 10^{-11}$ to $1.0 \times 10^{-10}$ ($Pa^{-1}$).

When a conventional long obliquely-stretched film obtained by obliquely stretching a long film having a photo-elastic coefficient falling within the above range is subjected to long-term storage, deformation of the film occurs due to winding displacement. In this case, the resulting film becomes uneven in terms of orientation angle developability, and thereby equality thereof as an optical film is likely to be impaired.

However, the long obliquely-stretched film according to this embodiment can suppress winding displacement even after long-term storage, as mentioned above. Thus, even in a situation where the long obliquely-stretched film obtained by obliquely stretching a long film having a photoelastic coefficient falling within the above range is subjected to long-term storage, it becomes possible to suppress deformation due to winding displacement to allow the long obliquely-stretched film to be suitably used as an optical film.

A widthwise thickness unevenness of the long obliquely-stretched film has an influence on success and failure (quality) of winding. Thus, it is preferably 3 μm or less, more preferably, 2 μm or less.

A value of in-plane retardation of the long obliquely-stretched film is preferably in the range of 120 nm to 160 nm, more preferably, 130 nm to 150 nm. The value of the in-plane retardation set in the above range makes it possible to suppress outside-light reflection and provide good display quality when it is used as a retardation film for a circularly polarizing plate for an organic EL display.

Variation of the in-plane retardation of the long obliquely-stretched film is preferably 3 nm or less, more preferably, 1 nm or less, in the widthwise direction. The variation of the in-plane retardation set in the above range makes it possible to suppress color unevenness in a black state of a display screen, or the like, when it is used as a retardation film for an organic EL display.

As the in-plane retardation of the long obliquely-stretched film, an optimal value is selected depending on design specifications of a display device using the film. The in-plane retardation of the film is a value obtained by multiplying a difference between a refractive index nx in a direction of an in-plane slow axis and a refractive index ny in a direction perpendicular to the slow axis in the plane by an average thickness da of the long obliquely-stretched film ((nx−ny)× da).

A haze of the long obliquely-stretched film is preferably set to 1.0% or less, more preferably, 0.5% or less, further preferably, 0.3% or less. An internal haze (internal haze/haze) of the long obliquely-stretched film is preferably set to 1 to 50% or less, more preferably, 1 to 30% or less, further preferably, 1 to 20% or less.

The haze and internal haze of the long obliquely-stretched film set in the above ranges makes it possible to suppress color unevenness in a black state of a display screen, or the like, when it is used as a retardation film for an organic EL display. The haze and internal haze of the long obliquely-stretched film may be measured by a conventional method as described in JP 2011-53645 A.

The long obliquely-stretched film according to this embodiment comprises a thermoplastic resin. The thermoplastic resin is not particularly limited. For example, in the case where the long obliquely-stretched film after stretching is used for optics applications, it is possible to desirably employ a thermoplastic resin having a transparent property with respect to a desired wavelength. Examples of such a thermoplastic resin may include a polycarbonate-based resin, a polyether sulfone-based resin, a polyethylene terephthalate-based resin, a polyimide-based resin, a polymethyl methacrylate-based resin, a polysulfone-based resin, a polyarylate-based resin, a polyethylene-based resin, a polyvinyl chloride-based resin, an olefin polymer-based resin having an alicyclic structure and a cellulose ester-based resin. Among them, the polycarbonate-based resin, the olefin polymer-based resin having an alicyclic structure and the cellulose ester-based resin are preferable from the viewpoint of transparency, mechanism strength and others. In particular, the polycarbonate-based resin can be used in this embodiment to produce a great effect, because many of polycarbonate-based resins have photoelastic coefficients falling within the above range.

<Polycarbonate-Based Resin>

A variety of polycarbonate-based resins can be used without particular restrictions. From the viewpoint of chemical properties and physical properties, it is preferable to use an aromatic polycarbonate resin, and it is particularly preferable to use a bisphenol A-based polycarbonate resin. In particular, it is more preferable to use a polycarbonate resin using a bisphenol A derivative in which a benzene ring, a cyclohexane ring, an aliphatic hydrocarbon group and the like are introduced into bisphenol A. Further, it is particularly preferable to use a polycarbonate resin obtained using a bisphenol A derivative in which the above functional groups are introduced asymmetrically with respect to a central carbon of bisphenol A, wherein this polycarbonate resin has a structure with reduced anisotropy in a unit molecule. Particularly preferable examples of such a polycarbonate resin include a polycarbonate resin obtained using a bisphenol A derivative in which two methyl groups bonded to the central carbon of bisphenol A is substituted by a benzene ring, and a polycarbonate resin obtained using a bisphenol A derivative in which one hydrogen of each benzene ring of bisphenol A is asymmetrically substituted by a methyl group, a phenyl group or the like with respect to the center carbon. Specific examples thereof include polycarbonate resins obtained from 4,4'-dihydroxydiphenyl alkanes and halogen substituents thereof by a phosgene method or a transesterification method, such as 4,4'-dihydroxydiphenyl methane, 4,4'-dihydroxydiphenyl ethane and 4,4'-dihydroxydiphenyl butane. In addition to these, examples thereof also include polycarbonate-based resins described, for example, in JP 2006-215465 A, JP 2006-91836 A, JP 2005-121813 A, JP 2003-167121 A, JP 2009-126128 A, JP 2012-31369 A, JP 2012-67300 A, and WO 00/26705 A.

The above polycarbonate resin may be used in the form of a mixture with a transparent resin such as a polystyrene-based resin, a methyl methacrylate-based resin or a cellulose acetate-based resin. Further, a resin layer containing a polycarbonate-based resin may be laminated on at least one surface of a resin film formed using a cellulose acetate-based resin.

Preferably, the polycarbonate-based resin has a glass transition temperature (Tg) of 110° C. or more, and a water absorption rate (a value measured after being immersed in water having a temperature of 23° C. for 24 hours) of 0.3% or less. More preferably, the Tg is 120° C. or more, and the water absorption rate is 0.2% or less.

A polycarbonate-based resin film usable in this embodiment may be formed by a conventional method. In particular, it is preferable to employ a solution casting process and melt casting process. Film-forming method is described hereinafter in detail.

<Alicyclic Olefin Polymer-Based Resin>

As the alicyclic olefin polymer based resin, it is possible to use a cyclic olefin random multi-component copolymer described in JP 05-310845 A, a hydrogen-added polymer described in JP 05-97978 A, a thermoplastic dicyclopentadiene-based ring-opening polymer and a hydrogenated product thereof described in JP 11-124429 A.

The alicyclic olefin polymer-based resin is a polymer having an alicyclic structure such as a saturated alicyclic hydrocarbon (cycloalkane) structure or an unsaturated alicyclic hydrocarbon (cycloalkene) structure. The number of carbon atoms constituting an alicyclic structure does not have any particular restriction. However, generally, the number of carbon atoms is set in the range of 4 to 30, preferably, 5 to 20, more preferably, 5 to 15, because this desirably provides high balance of mechanical strength, heat resistance and formability (moldability) of a long film.

While a ratio of an alicyclic structure-containing repeating unit in an alicyclic olefin polymer may be appropriately selected, it is preferably set to 55 weight % or more, more preferably 70 weight % or more, particularly preferably, 90 weight % or more. It is desirable that the ratio of the alicyclic structure-containing repeating unit in the alicyclic olefin polymer is in the above range, because this provides improvements in transparency and heat resistance of an optical material such as a retardation film obtained from the long obliquely-stretched film of one or more embodiments of the present invention.

Examples of the olefin polymer-based resins having an alicyclic structure may include a norbornene-based resin, a monocyclic olefin-based resin, a cyclic conjugated diene-based resin, a vinyl cyclic hydrocarbon-based resin and hydrides thereof. Among them, the norbornene-based resin may be suitably used, because it is excellent in transparency and formability (moldability).

Examples of the norbornene-based resin may include: a ring-opening polymer of monomers having a norbornene structure, a ring-opening copolymer of a monomer having a norbornene structure and other monomer, hydrides thereof; an addition polymer of monomers having a norbornene structure, an addition copolymer of a monomer having a norbornene structure and other monomer and hydrides thereof. Among them, the hydride of the ring-opening (co)polymer of monomers having a norbornene structure may be particularly suitably used from the viewpoint of transparency, formability (moldability), heat resistance, low moisture absorbing property, dimensional stability and lightweight property.

As a method for forming a long film using the above norbornene-based resin, it is preferable to use a production method based on a solution film-forming process or a melt extrusion process. Examples of the melt extrusion process include an inflation process using a die. In this case, it is preferable to employ a process using a T-die, because it is excellent in productivity and thickness accuracy.

An extrusion molding process using a T-die is capable of producing a long film having a small variation of optical properties such as retardation and orientation angle by a technique of allowing a thermoplastic resin in a molten state to be kept in a stable state during an operation of bringing the resin into close contact with a cooling drum, as described in JP 2004-233604 A.

Specific examples thereof include 1) a technique of, during production of a long film by the melt extrusion process, taking up a sheet-shaped thermoplastic resin extruded from a die, while bringing the resin into close contact with a cooling drum under a pressure of 50 kPa or less; 2) a technique of, during production of a long film by the melt extrusion process, covering by an enclosure member a region from a die opening to a first-contactable cooling drum, and setting a distance between the enclosure member and the die opening or the first-contactable cooling drum to 100 mm or less; 3) a technique of, during production of a long film by the melt extrusion process, heating an atmosphere within 10 mm from a sheet-shaped thermoplastic resin extruded from a die opening, up to a specific temperature; 4) a technique of taking up a sheet-shaped thermoplastic resin extruded from a die in a manner satisfying a given relationship, while bringing the resin into close contact with a cooling drum under a pressure of 50 kPa or less; and 5) a technique of, during production of a long film by the melt extrusion process, blowing air against a sheet-shaped thermoplastic resin extruded from a die opening, at a speed different from a taking-up speed of a first-contactable cooling drum by 0.2 m/s or less.

The long film may be a single-layered film or multi-layered film. The multi-layered film can be obtained by a conventional method such as a co-extrusion molding process, a co-casting process, a film lamination process or a coating process. Among them, the co-extrusion molding process and the co-casting process are preferable.

<Cellulose Ester-Based Resin>

Examples of the cellulose ester-based resin include a cellulose ester-based resin containing cellulose acylate satisfying the following formulas (i) and (ii) and containing a compound represented by the following general formula (A).

$2.0 \leq Z1 < 3.0$      Formula (i)

$0.5 \leq X$      Formula (ii)

In the Formulas (i) and (ii), Z1 represents total acyl substitution degree of cellulose acylate, and X represents the sum of propionyl substitution degree and butyryl substitution degree of cellulose acylate.

(Compound Represented by General Formula (A))

The general formula (A) will be described in detail below.

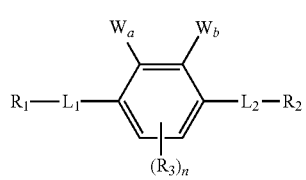

General formula (A)

In the general formula (A), $L_1$ and $L_2$ each independently represents a single bond or divalent linking group Examples of $L_1$ and $L_2$ include the following structure (R in the following structure represents a hydrogen atom or a substituent group).

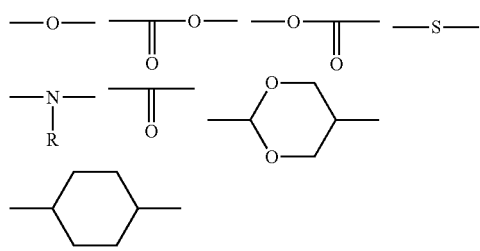

Preferably, each of $L_1$ and $L_2$ is —O—, —COO— or —OCO—. $R_1$, $R_2$ and $R_3$ each independently represents a substituent group.

Each of $R_1$ and $R_2$ is preferably a substituted or non-substituted phenyl group or a substituted or non-substituted cyclohexyl group, more preferably, a phenyl group having a substituent group or a cyclohexyl group having a substituent group, further preferably, a phenyl group having a substituent group at the 4-position or a cyclohexyl group having a substituent group at the 4-position.

$R_3$ is preferably a hydrogen atom, a halogen atom, an alkyl group, an alkenyl group, a aryl group, a hetero ring group, a hydroxyl group, a carboxyl group, an alkoxy group, an aryloxy group, an acyloxy group, a cyano group or an amino group, further preferably, a hydrogen atom, a halogen atom, an alkyl group, a cyano group or an alkoxy group.

Each of Wa and Wb represents a hydrogen atom or a substituent group, wherein:
(I) Wa and Wb may be bonded together to form a ring, or
(II) at least one of Wa and Wb may have a ring structure, or
(III) at least one of Wa and Wb may be an alkenyl group or an alkynyl group.

(I) When Wa and Wb are bonded together to form a ring, the ring includes the following structure.

When Wa and Wb are bonded together to form a ring, the ring is preferably a nitrogen-containing 5-membered ring or a sulfur-containing 5-membered ring, particularly preferably, a compound represented by the following general formulas (1) or (2).

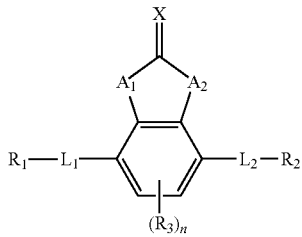

General Formula (1)

In the general formula (1), $A_1$ and $A_2$ each independently represents —O—, —S—, —NRx- (Rx represents a hydrogen atom or a substituent group) or CO—. Examples of the substituent group represented by Rx are synonymous with the specific examples of the substituent groups represented by the Wa and Wb. Rx is preferably a hydrogen atom, an alkyl group, an aryl group or a hetero ring group. In the general formula (1), X represents a non-metal atom of Groups 14 to 16. X is preferably =O, =S, =NRc or =C(Rd)Re, wherein each of Rc, Rd and Re represents a substituent group and examples thereof are synonymous with the specific examples of the substituent groups represented by the Wa and Wb. $L_1$, $L_2$, $R_1$, $R_2$, $R_3$ and n are synonymous with $L_1$, $L_2$, $R_1$, $R_2$, $R_3$ and n in the general formula (A).

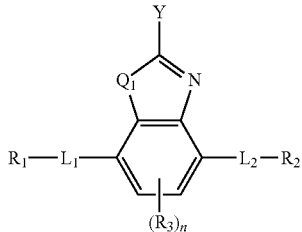

General Formula (2)

In the general formula (2), $Q_1$ represents —O—, —S—, —NRy- (Ry represents a hydrogen atom or a substituent group) or —CRaRb- (Each of Ra and Rb represents a hydrogen atom or a substituent group) or CO—, wherein each of Ry, Ra and Rb represents a substituent group, and examples thereof are synonymous with the specific examples of the substituent groups represented by the Wa and Wb.

Y represents a substituent group. Examples of the substituent group represented by Y are synonymous with the specific examples of the substituent groups represented by the Wa and Wb. Y is preferably an aryl group, a hetero ring group, an alkenyl group or an alkynyl group. Examples of the aryl group represented by Y include a phenyl group, a naphtyl group, an anthryl group, a phenanthryl group and a biphenyl group. Among them, the phenyl group and the naphtyl group are preferable, and the phenyl group is more preferable.

Examples of the hetero ring group include a hetero ring group comprising at least one heteroatom such as a nitrogen atom, an oxygen atom or a sulfur atom, for example, a furyl group, a prolyl group, a thienyl group, a pyridinyl group, a thiazolyl group or a benzothiazolyl group. Among them, the furyl group, the pyrrolyl group, the thienyl group, the pyridinyl group and the thiazolyl group are preferable.

The above aryl groups or hetero ring groups may have at least one substituent group. Examples of the substituent group include a halogen atom, an alkyl group having a carbon number of 1 to 6, a cyano group, a nitro group, an alkyl sulfinyl group having a carbon number of 1 to 6, an alkyl sulfonyl group having a carbon number of 1 to 6, a carboxyl group, a fluoroalkyl group having a carbon number of 1 to 6, an alkoxyl group having a carbon number of 1 to 6, an alkylthio group having a carbon number of 1 to 6, an N-alkyl amino group having a carbon number of 1 to 6, an N,N-dialkyl amino group having a carbon number of 2 to 12, an N-alkyl sulfamoyl group having a carbon number of 1 to 6 and an N,N-dialkyl sulfamoyl group having a carbon number of 2 to 12.

$L_1$, $L_2$, $R_1$, $R_2$, $R_3$ and n are synonymous with $L_1$, $L_2$, $R_1$, $R_2$, $R_3$ and n in the general formula (A).

(II) A specific preferred example of the general formula (A) in which at least one of Wa and Wb has a ring structure is the following general formula (3).

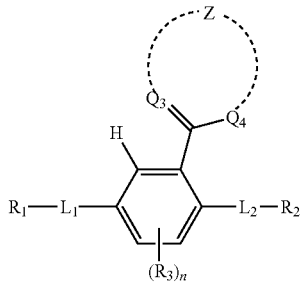

General Formula (3)

In the general formula (3), Q represents =N— or =CRz- (Rz represents a hydrogen atom or a substituent group), and $Q_4$ represents a non-metal atom of Group 14 to 16. Z represents a non-metal atom group which forms a ring together with $Q_3$ and $Q_4$. The ring formed from $Q_3$, $Q_4$ and Z may be further condensed with another ring. The ring formed from $Q_3$, $Q_4$ and Z is preferably a nitrogen-containing 5-membered ring or 6-membered ring condensed with a benzene ring. $L_1$, $L_2$, $R_1$, $R_2$, $R_3$ and n are synonymous with $L_1$, $L_2$, $R_1$, $R_2$, $R_3$ and n in the general formula (A).

(III) When at least one of Wa and Wb is an alkenyl group or an alkynyl group, it is preferably a vinyl group or an ethynyl group having a substituent group.

Among the compounds represented by the above general formulas (1), (2) and (3), the compound represented by the general formula (3) is particularly preferable.

The compound represented by the general formula (3) is excellent in heat resistance and light resistance, as compared to the compound represented by the general formula (1), and has good solubility to an organic solvent and good compatibility with a polymer, as compared to the compound represented by the general formula (2).

The compound represented by the general formula (A) in this embodiment may be contained by adjusting an amount appropriate for imparting a desired wavelength dispersion property and anti-bleed out property. The compound is added to a cellulose derivative in an amount, preferably, of 1 to 15 mass %, particularly preferably, of 2 to 10 mass %. The addition in this range makes it possible to sufficiently impart the wavelength dispersion property and anti-bleed out property to the cellulose derivative in this embodiment.

The compounds represented by the general formulas (A), (1), (2) and (3) can be synthesized by referring to a heretofore-known method. Specifically, they can be synthesized by referring to Journal of Chemical Crystallography (1997): 27(9); 512-526, JP 2010-31223 A and JP 2008-107767 A and others.

(Cellulose Acylate)

A cellulose acylate film usable in this embodiment contains cellulose acylate as a primary component.

The cellulose acylate film usable in this embodiment preferably contains cellulose acylate in an amount of 60 to 100 mass % with respect to a total mass (100 mass %) of the film.

Examples of cellulose acylate include esters of celluloses and aliphatic carboxylic acids and/or aromatic carboxylic acids having a carbon number of about 2 to 22. In particular, esters of celluloses and lower fatty acids having a carbon number of 6 or less are preferable.

An acyl group bonded to a hydroxyl group of cellulose may be straight-chained or branched, or may form a ring. Further, it may be substituted by another substituent group. Assuming the same substitution degree, an excessive increase in the above carbon number causes deterioration in birefringent property. Thus, as regards the carbon number, it is preferable to select one of acyl groups having a carbon number of 2 to 6, and the sum of a propionyl substitution degree and a butyryl substitution degree is 0.5 or more. The carbon number of the cellulose acylate is preferably 2 to 4, more preferably, 2 to 3.

Specifically, as cellulose acylate, it is possible to use a mixed fatty acid ester of cellulose to which not only an acetyl group but also a propionate group, a butyrate group or a phtharyl group is bonded, such as cellulose acetate propionate, cellulose acetate butyrate, cellulose acetate propionate butyrate or cellulose acetate phthalate. A butyryl group forming butyrate may be straight-chained or branched.

In this embodiment, as cellulose acylate, it is possible to particularly desirably use cellulose acetate, cellulose acetate butyrate or cellulose acetate propionate.

Preferably, the cellulose acylate in this embodiment is a type simultaneously satisfying both the following formulas (iii) and (iv).

$$2.0 \le X+Y < 3.0 \qquad \text{Formula (iii)}$$

$$0.5 \le X \qquad \text{Formula (iv)}$$

In the formulas, Y represents a substitution degree by acetyl group, and X represents a substitution degree by propionyl group, butyryl group or a mixture thereof.

In order to obtain optical properties meeting an intended purpose, resins having different substitution degrees may be mixed and used. In this case, it is preferable to set a mixing ratio thereof in the range of 1:99 to 99:1 (mass ratio).

Among those mentioned above, cellulose acetate propionate is particularly desirably used as cellulose acetate. In the cellulose acetate propionate, it is preferable that $0 \le Y \le 2.5$, and $0.5 \le X \le 3.0$ (where $2.0 \le X+Y < 3.0$), and it is more preferable that $0.5 \le Y \le 2.0$, and $1.0 \le X \le 2.0$ (where $2.0 \le X+Y < 3.0$). The acyl group substitution degree can be measured according to ASTM-D817-96.

There is no particular restriction on cellulose as a raw material for cellulose acylate. Examples thereof include cotton linter, wood pulp, and kenaf. Cellulose acylate obtained therefrom may be mixed at any ratio and used.

Cellulose acylate can be produced by a heretofore-known method. Specifically, it can be synthesized, for example, by referring to the method described in JP 10-45804 A.

(Additives)

The long obliquely-stretched film according to this embodiment may be obtained by appropriately mixing an aftermentioned polymer component other than a cellulose ester. Preferably, the polymer component to be mixed has excellent compatibility with a cellulose ester, and a transmittance in the form of a long obliquely-stretched film is preferably 80% or more, more preferably, 90% or more, further preferably, 92% or more.

Examples of an additive to be added include a plasticizer, an ultraviolet absorber, a retardation adjuster, an antioxidant, a deterioration inhibitor, a release assistant, a surfactant, a dye, and fine particles. In this embodiment, an additive other than fine particles may be added during preparation of a cellulose ester solution or may be added during preparation of a fine particle-dispersed liquid. It is preferable to add a plasticizer to provide heat and moisture resistance, an antioxidant, an ultraviolet absorber and others to a polarizing plate for use in an image display device such as an organic EL display.

Preferably, those compounds are contained in a cellulose ester in an amount of 1 to 30 mass %, preferably, 1 to 20 mass %. With a view to suppressing bleed out and the like during stretching and drying, it is preferable that these compounds have a vapor pressure of 1400 Pa or less at 200° C.

Those compounds may be added together with a cellulose ester and a solvent in advance of preparation of a cellulose ester solution or during or after preparation of the solution.

(Retardation Adjuster)

As a compound to be added to adjust retardation, it is possible to use an aromatic compound having two or more aromatic rings, as described in EP 911,656 A2.

Two or more types of aromatic compounds may be used in combination. Examples of an aromatic ring of such an aromatic compound include an aromatic hydrocarbon ring and an aromatic hetero ring. Particularly preferably, it is an aromatic hetero ring, wherein the aromatic hetero ring is generally an unsaturated hetero ring. In particular, 1,3,5-triazine ring is preferable.

(Polymer or Oligomer)

In this embodiment, it is preferable that a cellulose ester film contains a cellulose ester, and a polymer or oligomer of a vinyl-based compound having a substituent group selected from the group consisting of a carboxyl group, a hydroxyl group, an amino group, an amide group and a sulfonic acid group and having a weight-average molecular weight ranging from 500 to 200,000. Preferably, a content ratio by mass of the cellulose ester to the polymer or the oligomer is in the range of 95:5 to 50:50.

(Matting Agent)

In this embodiment, as a matting agent, it is possible to incorporate fine particles in the long obliquely-stretched film to thereby make it possible to facilitate transportation and winding-up in a situation where a stretched film is a long type.

Preferably, the matting agent is primary particles or secondary particles having a particle size of 10 nm to 0.1 μm. It is possible to desirably use a matting agent comprising approximately spherical-shaped primary particles having an acicular ratio (aspect ratio) of 1.1 or less.

As the fine particles, a type containing silicon is preferable, and silicon dioxide is particularly preferable. Examples of fine particles of silicon dioxide preferably usable in this embodiment include fine particles commercially offered under the following trade names: Aerosil R972, R972V, R974, R812, 200, 200V, 300, R202, OX50 and TT600 (produced by Nippon Aerosil Co., Ltd.), and it is possible to desirably use Aerosil 200V, R972, R972V, R974, R202 and R812. Examples of a polymer for the fine particles include a silicone resin, a fluorine resin and an acrylic resin. Among them, silicone resin is preferable, and a type having a three-dimensional net-like structure is particularly preferable. Examples thereof include Tospearl 103, Tospearl 105, Tospearl 108, Tospearl 120, Tospearl 145, Tospearl 3120 and Tospearl 240 (produced by Toshiba Silicone Co., Ltd.).

(Other Additives)

As other additives, it is possible to add inorganic fine particles, such as kaolin, talc, diatomaceous earth, quartz, calcium carbonate, barium sulfate, titanium oxide or alumina, and a thermal stabilizer, such as a salt of an alkaline-earth metal such as calcium or magnesium. It is also possible to further add a surface-active agent, a release assistant, an antistatic agent, a flame-retardant, a lubricant, an oily agent and others.

A cellulose ester-based resin film usable in this embodiment can be formed by a heretofore-known method. In particular, it is preferable to use a solution casting process and melt casting process. Film-forming method is described hereinafter in detail.

<Circularly Polarizing Plate>

In a circularly polarizing plate according to one or more embodiments of the present invention, a polarizing-plate protection film, a polarizer, a λ/4 retardation film (the long obliquely-stretched film according to the aforementioned embodiment) and a pressure-sensitive adhesive film are laminated in this order, and an angle defined between a slow axis of the λ/4 retardation film and an absorption axis of the polarizer is 45°.

In this embodiment, it is preferable that a long polarizing-plate protection film, a long polarizer and a long λ/4 retardation film are laminated in this order.

The circular polarizing plate according to this embodiment can be produced by using as the polarizer a stretched polyvinyl alcohol-based film doped with iodine or dichroic dye, and forming a laminate structure of the λ/4 retardation film/the polarizer.

A film thickness of the polarizer is 5 to 40 μm, preferably, 5 to 30 μm, particularly preferably, 5 to 20 μm.

The polarizing plate can be produced by a commonly-used method. Preferably, using an aqueous solution of completely saponified polyvinyl alcohol, the λ/4 retardation film subjected to an alkali saponification treatment is laminated to one surface of the polarizer produced by stretching a polyvinyl alcohol-based film while immersing it in an iodine solution.

The polarizing plate can be constructed by further laminating a releasable film to a surface of the polarizing plate on a side opposite to the polarizing plate protection film. The protection film and the releasable film are used for the purpose of protecting the polarizing plate during shipment of the polarizing plate, inspection of a resulting product and the like.

<Organic EL Display>

A λ/4 plate using the long obliquely-stretched film according to the aforementioned embodiment is particularly desirably used as a circular polarizing plate used to prevent reflection of a self-luminous display device such as an organic EL display. The long obliquely-stretched film according to the aforementioned embodiment is excellent in uniformity in terms of direction of a slow axis with respect to the widthwise direction of the film (direction of the orientation angle), so that it can provide a display device particularly excellent in hue uniformity when used in an organic EL display.

Figure 3:
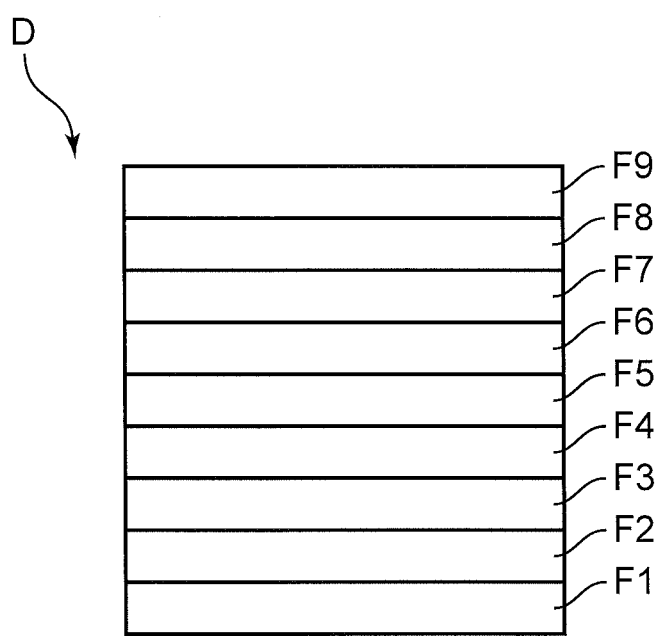
FIG. 3 is a schematic diagram illustrating a configuration of an organic EL display according to one or more embodiments of the present invention.

Although FIG. 3 illustrates one example of a configuration of an organic EL display D according to one or more embodiments of the present invention, it is to be understood that the present invention is not limited thereto. FIG. 3 is a schematic diagram illustrating the configuration of the organic EL display according to this embodiment.

As illustrated in FIG. 3, the organic EL display D is constructed by providing a circularly polarizing plate on an organic EL element, wherein the organic EL element comprises a metal electrode F2, a luminous layer F3, a transparent electrode (such as ITO) F4 and a sealing layer F5 which are formed in this order on a substrate F1 made, for example, of glass or polyimide, through an adhesive layer F6, and the circularly polarizing plate has a polarizer F8 sandwiched between a λ/4 retardation film F7 and a protection film F9. Preferably, a hardened layer is laminated on the protection film F9. The hardened layer has an effect of not only preventing scratching of a surface of the organic EL display but also preventing warpage due to the circularly polarizing plate. A reflection preventing layer may be provided on the hardened layer. A thickness of the organic EL element itself is about 1 μm.

Generally, in an organic EL display, an element as a luminescent body (organic EL element) is formed by laminating a metal electrode, a luminescent layer and a transparent electrode onto a transparent electrode in this order. In this case, the luminescent layer is a laminate of various organic thin films. As such a laminate, there have been known various combinational laminates, such as: a laminate of a hole injection layer made, for example, of triphenylamine derivative, and a luminescent layer consisting of a fluorescent organic solid such as anthracene; a laminate of the luminescent layer, and an electron injection layer made, for example, of perylene derivative; and a laminate of the hole injection layer, the luminescent layer, and the electron injection layer.

The organic EL display can emit light based on a principle that, when a voltage is applied between the transparent electrode and the metal electrode, holes and electrons are injected into the luminescent layer and recombined to excite a fluorescent substance based on energy generated by the recombination, and then when the excited fluorescent substance returns to a ground state, it emits light. A mechanism of the recombination occurring in the intermediate stage is the same as that in a commonly-used diode. As can be expected from this fact, each of current and luminescence intensity exhibits a strong non-linearity involving rectification, with respect to an applied voltage.

In the organic EL display, in order to extract light emitted from the luminescent layer, it is necessary that at least one of two electrodes is transparent. Generally, it is preferable to use, as a positive electrode, a transparent electrode made of as a transparent electrically conductive material such as indium tin oxide (ITO). On the other hand, for facilitating electron injection to enhance luminous efficacy, it is important to use, as a negative electrode, a material having a relatively small work function. Generally, a metal electrode such as Mg—Ag or Al—Li is used.

In the organic EL display configured as above, the luminescent layer is formed as a layer having an extremely small thickness of about 10 nm. Thus, the luminescent layer can fully transmit light therethrough, as with the transparent electrode. Thus, light entering from a front surface of the transparent electrode is transmitted through the transparent electrode and the luminescent layer and reflected by the metal electrode, and the reflected light is transmitted toward the front surface of the transparent electrode again. Thus, when viewed from the outside, a display screen of the organic EL display looks like a specular surface.

The circularly polarizing plate formed using the long obliquely-stretched film according to the aforementioned embodiment is suitable for an organic EL display.

<Production Method for Long Obliquely-Stretched Film>

The long obliquely-stretched film according to the aforementioned embodiment is obtained by adjusting conditions, particularly, for an oblique stretching step of a production process. Therefore, in the following description about the production method, the oblique stretching step will be particularly specifically described.

(Oblique Stretching Step)

The oblique stretching step is a step of stretching a formed long film in a direction oblique to a widthwise direction of the film. The long obliquely-stretched film is continuously produced from the long film, so that it is possible to produce the long obliquely-stretched film to have a desired arbitrary length. As regards the long film, after completion of a film formation step, it may be wound around a winding core once to form a wound body and then supplied to the oblique stretching step, or may be successively supplied to the oblique stretching step from the film formation step without being wound. It is preferable to successively perform the film formation step and the oblique stretching step, because film formation conditions can be changed by feeding back a film thickness and optical values of a resulting stretched film to thereby obtain a desired long obliquely-stretched film.

In the production method for the long obliquely-stretched film according to the aforementioned embodiment, it is possible to produce a long obliquely-stretched film having a slow axis in a direction defining an angle of greater than 0° to less than 90° with respect to the widthwise direction of the long film, wherein the angle with respect to the widthwise direction of the long film means an angle in the plane of the long film. Generally, a slow axis is developed in a stretching direction or in a direction perpendicular to the stretching direction. Thus, the production method for the long obliquely-stretched film according to the aforementioned embodiment is capable of performing stretching in a direction defining an angle of greater than 0° to less than 90° with respect to the widthwise direction of the long film to thereby produce the long obliquely-stretched film having such a slow angle.

An angle defined between the widthwise direction of the long obliquely-stretched film and the slow axis, i.e. an orientation angle, may be arbitrarily set at a desired angle within the range of greater than 0° to less than 90°.

(Stretching by Oblique Stretching Apparatus)

A bending type oblique stretching apparatus is used to impart an oblique orientation to the long film so as to obtain the long obliquely-stretched film according to the aforementioned embodiment. The bending type oblique stretching apparatus is capable of variously changing a route pattern of a gripper travel support device to thereby freely set the orientation angle of the film, further orienting an orientation axis of the film equally on both right and left sides to extend in the widthwise direction of the film, with a high degree of accuracy, and controlling the film thickness and the retardation with a high degree of accuracy.

Figure 4:
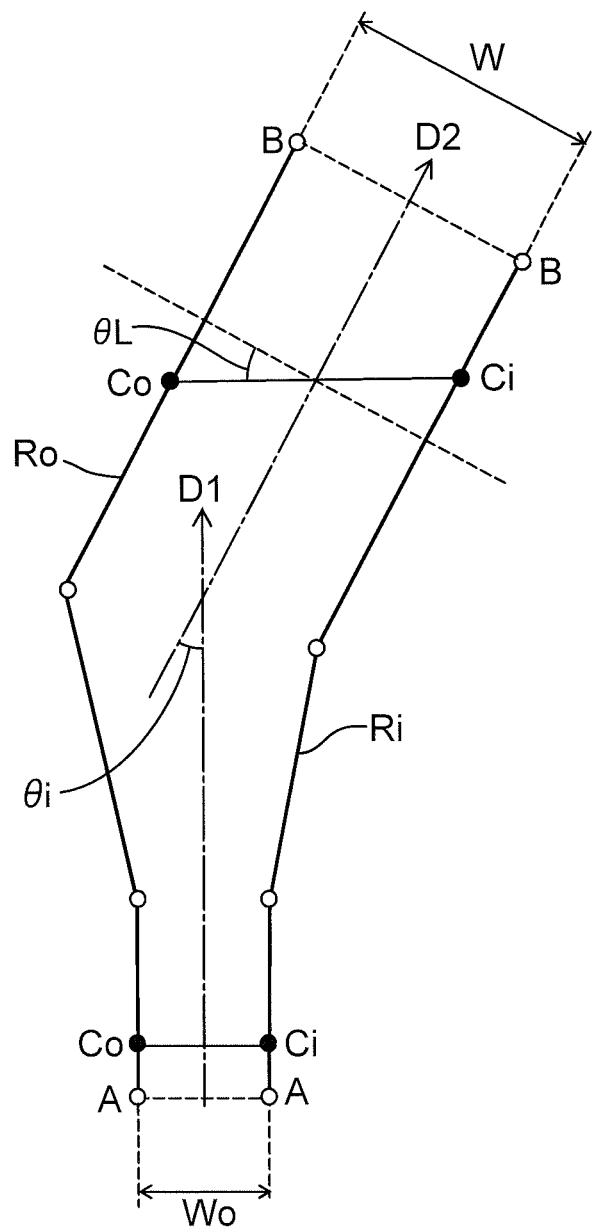
FIG. 4 is a schematic diagram illustrating a configuration of an oblique stretching apparatus for stretching a long film, according to one or more embodiments of the present invention.

FIG. 4 is a schematic diagram illustrating a configuration of the oblique stretching apparatus for stretching a long film, according to one or more embodiments of the present invention. It should be noted that this is described by way of an example and the present invention is not limited thereto.

A feeding direction D1 of the long film is different from a winding direction D2 of the long obliquely-stretched film after stretching, to define an extension angle θi therebetween. The extension angle θi can be arbitrarily set at a desired angle within the range of greater than 0° to less than 90°.

Opposite lateral ends of the long film are held by right and left grippers Ci, Co at an inlet of the oblique stretching apparatus (holding start points where the right and left grippers start to hold the long film; a straight line connecting the holding start points is indicated by the reference sign A), and the long film travels along with traveling of the grippers.

The grippers Ci, Co travel, respectively, along bilaterally asymmetric routes, and release a holding state of the long obliquely-stretched film at a position where stretching is terminated (a holding release points where the grippers release the holding state; a straight line connecting the holding release points is indicated by the reference sign B).

In this process, as the right and left grippers located in opposed relation at the inlet of the oblique stretching apparatus (at the position A-A in FIG. 4) travel, respectively, along an inner gripper travel support device Ri and an outer gripper travel support device Ro which are bilaterally asymmetric, the gripper Ci traveling along the inner gripper travel support device Ri and the gripper Co traveling along the outer gripper travel support device Ro have a positional relationship in which the gripper Ci goes ahead of the gripper Co.

Specifically, in a state in which the grippers Ci, Co which have been located in opposed relation in a direction approximately perpendicular to the feeding direction D1 of the long film, at the inlet of the oblique stretching apparatus, are located at a position B-B, a straight line connecting the grippers Ci, Co is inclined with respect to the direction approximately perpendicular to the winding direction D2 of the long obliquely-stretched film by an angle θL.

Along with the above movements, the long film is obliquely stretched in a direction of the angle θL. As used herein, the term "approximately perpendicular" means an angle falling within 90±1°.

The gripper travel support devices each provided with a plurality of the grippers have endless continuous tracks, respectively, wherein the gripper travel support device is configured such that the grippers releasing the holding state of the long obliquely-stretched film at an exit of the stretching apparatus are sequentially returned to the holding start point.

For example, the gripper travel support device may be a configuration in which an endless chain whose track is regulated by a guide rail or a gear is provided with a plurality of grippers, or may be a configuration in which an endless guide rail is provided with a plurality of grippers. Specifically, in this embodiment, the gripper travel support device may be a non-endless guide rail equipped with an endless chain, or may be an endless guide rail equipped with an endless chain, or may be an endless guide rail devoid of a chain. In the case where the gripper travel support device is devoid of a chain, the gripper travels along a track of the gripper travel support device itself. On the other hand, in the case where the gripper travel support device is equipped with a chain, the gripper travels along a track of the gripper travel support device via the chain. Although this embodiment will be described below based on one example where the grippers travel along the track of the gripper travel support device, the stretching apparatus may be configured such that the gripper travels along the track of the gripper travel support device via the chain to which the gripper is installed.

The gripper travel support devices of the stretching apparatus are formed into shapes which are bilaterally asymmetric with respect to each other, to allow a track pattern to be manually or automatically adjusted depending on the orientation angle to be imparted to the long obliquely-stretched film to be produced, a stretching ratio and the like.

A length (overall length) of each of the gripper travel support devices is not particularly limited.

In this embodiment, while a stretching speed of the film may be appropriately selected, it is particularly preferably set to 10 to 20000%/min. If the stretching speed of the film is less than 10%/min, it needs to take an excessively long tome for stretching, so that a stress necessary for orientation is relaxed, causing difficulty in developing a desired orientation angle. On the other hand, if the stretching speed of the film is greater than 20000%/min, a local stretching stress applied to a necking portion of lateral ends of the film is excessively increased, so that wrinkles and/or shifting tend to occur in the film, or the film is apt to tear, causing breakage during conveyance.

A difference between respective traveling speeds of the pair of grippers at least gripping the film is normally 1% or less, preferably, 0.5% or less, more preferably, 0.1% or less of the traveling speeds, i.e., respective traveling speeds of the pair of grippers are substantially the same speed. This is because if there is a difference in traveling speed between right and left ends of the film at an exit of a stretching station, wrinkles and/or shifting occur at the exit of the stretching station, and therefore it is necessary for the right and left grippers making up the gripper pair to have substantially the same speed, i.e., no speed difference therebetween.

Particularly, the gripper travel support device regulating the track of each of the grippers is often required to have a large bending curvature, particularly in an area where the conveyance of the long film becomes oblique. From the viewpoint of avoiding interference between the grippers or local stress concentration due to sharp bending, it is preferable to allow the track of the gripper to form a curved line at the bent area.

In this embodiment, the long film is conveyed together with the grippers being traveling, to pass through a non-illustrated heating zone including a preheating zone, stretching zone, heat setting zone and cooling zone.

The preheating zone means a zone in which the pair of grippers holding the opposite lateral ends travel while maintaining a distance therebetween constant in an inlet region to the heating zone.

The stretching zone means a zone in which the distance between the pair of grippers holding the opposite lateral ends starts increasing and then reaches a given distance. The stretching apparatus according to this embodiment is configured to perform oblique stretching in the stretching zone. Alternatively, instead of performing only the oblique stretching, after performing transverse stretching in the stretching zone, the oblique stretching may be performed. Alternatively, after performing the oblique stretching, an additional stretching may be performed in the widthwise direction.

The heat setting zone means a subsequent zone to the stretching zone, in which the distance between the pair of grippers becomes constant again, wherein the pair of grippers holding the opposite lateral ends travel while maintaining a translational movement. After passing through the heat setting zone, the long obliquely-stretched film may pass through a zone in which a temperature therein is set to be equal to or less than a glass transition temperature Tg (° C.) of the thermoplastic resin constituting the long film (cooling zone). In this case, the track pattern may be preliminarily set in such a manner that the distance between the opposed grippers is narrowed, considering shrinkage of the long obliquely-stretched film due to the cooling.

In this embodiment, in the stretching zone, it is possible to form an orientation angle such that an angle defined between the orientation angle and a widthwise direction of the film has a cycle length of 10 mm to less than 1500 mm in the longitudinal direction of the film, wherein an amplitude of the angle in the cycle length cyclically changes in the longitudinal direction in the range of 0.2° to 1.0°. A method for forming such an orientation angle in the long film is not particularly limited, and it is possible to employ various techniques, such as: a technique of installing a heater capable of being turned on/off and adjustably changing a heating temperature, so as to impart a temperature difference along a longitudinal direction of a long film being conveyed; a technique of preliminarily providing a roll configured to adjust a surface temperature thereof, and bringing a long film being conveyed, into contact with the roll to thereby impart a temperature difference along a longitudinal direction of the long film, and a technique of adjusting a holding force (strength of holding a long film being conveyed) of each of a plurality of grippers holding the long film.

Figure 5A:
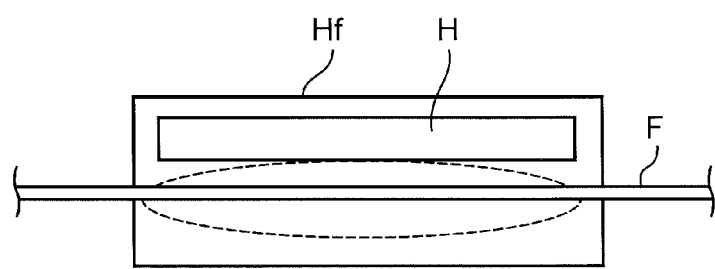
FIGS. 5 (a) and (b) are schematic diagrams illustrating a technique of imparting a temperature difference along a longitudinal direction of a long film being conveyed.
Figure 5B:
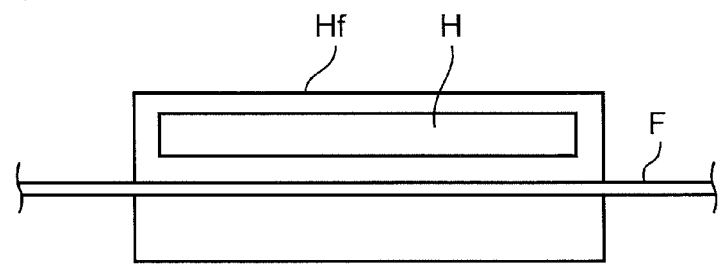

FIG. 5 is a schematic diagram illustrating a technique of imparting a temperature difference along a longitudinal direction of a long film F being conveyed, wherein FIG. 5(a) is a schematic diagram illustrating a state in which heating is performed using a heater H, and FIG. 5(b) is a schematic diagram illustrating a state in which heating is not particularly performed. In FIG. 5(a), a region surrounded by the broken line indicates an area which is heated by the heater H.

As illustrated in FIG. 5(a), by the heater H installed in an upper region of an inside of a heating furnace Hf, the long film F being conveyed is heated up to a stretching temperature or more, and further heated up to a temperature greater than the stretching temperature. On the other hand, when the heater H is not driven as illustrated in FIG. 5(b), the long film F is stretched at the stretching temperature.

When the heater H is switched from an ON state (state illustrated in FIG. 5(a)) to an OFF state (state illustrated in FIG. 5(b)), the temperature of the long film F is gradually lowered from the temperature-raised state to the stretching temperature. On the other hand, when the heater H is switched from the OFF state (state illustrated in FIG. 5(b)) to the ON state (state illustrated in FIG. 5(a)), the temperature of the long film F is gradually raised from the temperature-lowered state.

Thus, by periodically (cyclically) switching between the ON state and the OFF state of the heater H, a temperature difference continuous in the longitudinal direction can be provided to the long film F being conveyed. This makes it possible to form an orientation angle in the long film F in such a manner that an angle defined between the orientation angle and a widthwise direction of the film has a cycle length of 10 mm to less than 1500 mm in a longitudinal direction of the film, wherein an amplitude of the angle in the cycle length cyclically changes in the longitudinal direction in the range of 0.2° to 1.0°.

A type of the heater H is not particularly limited, by may be a heater capable of imparting a continuous temperature difference to the long film F being conveyed. For example, it is possible to employ an infrared heater, an electric heater or the like.

The temperature of the long film F during heating by the heater H is not particularly limited, but may be any temperature causing the above amplitude. For example, it is possible to set a temperature greater than the stretching temperature by 5 to 50° C.

A condition for the switching between the ON state and the OFF state of the heater H is not particularly limited. For example, it is possible to employ a setting of maintaining the OFF state for 0.1 to 20 seconds after continuing the ON state for 0.1 to 20 seconds. As one of other examples, it is possible to switch between the ON state and the OFF state of the heater H with monitoring temperature of the long film F being conveyed.

This embodiment discloses as an example the technique of switching between the ON state and the OFF state of the heater H. However, this embodiment is not limited thereto. That is, it is not necessary to fully switch the heater H from the ON state to the OFF state, i.e. it is possible to employ a technique of increasing and reducing an output of the heater H.

Further, instead of switching the heater H to the OFF state, the temperature difference along the longitudinal direction may be imparted while maintaining the ON state, for example, by blowing air against the long film F being conveyed.

Figure 6B:
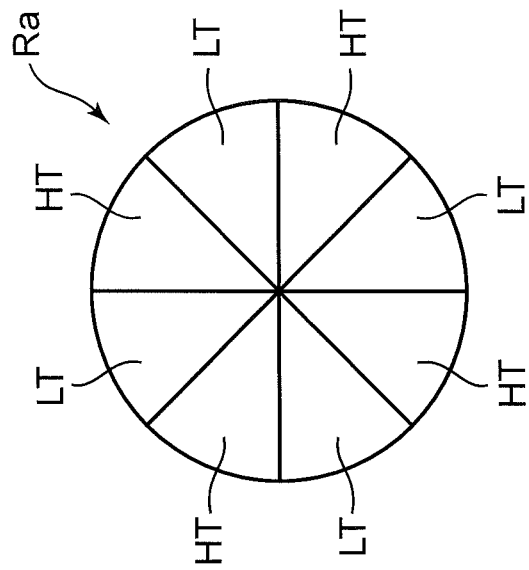
FIGS. 6 (a) and (b) are schematic diagrams illustrating the technique of imparting a temperature difference along a longitudinal direction of a long film being conveyed.
Figure 6A:
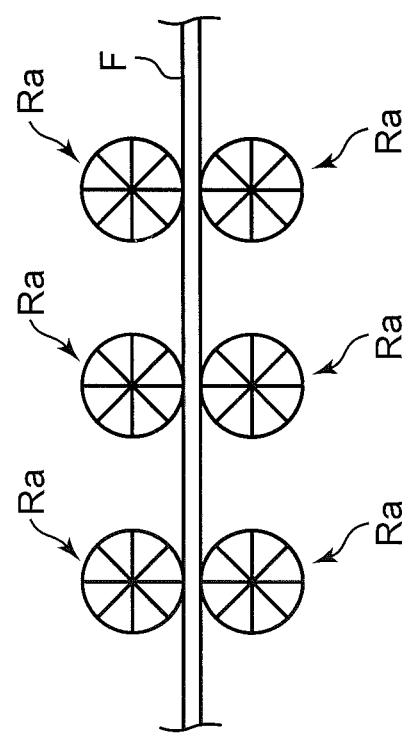

FIG. 6 is a schematic diagram illustrating the technique of imparting a temperature difference along a longitudinal direction of a long film F being conveyed, wherein FIG. 6(a) is a schematic diagram illustrating a state of an operation of heating or cooling the long film F by bringing it into contact with a roll Ra, and FIG. 6(b) is a schematic diagram illustrating a configuration of the roll Ra.

As illustrated in FIG. 6(a), a long film F being conveyed is brought into contact with a roll Ra, from an up-down direction, wherein the roll Ra is configured to adjust a surface temperature thereof. The roll Ra is rotatably provided along the long film F being conveyed. As illustrated in FIG. 6(b), a surface of the roll Ra has a portion adjusted to have a high temperature which is greater than a stretching temperature (high-temperature portion HT) and a portion adjusted to have a low temperature (low-temperature portion LT). Thus, a temperature difference is imparted to the long film F being conveyed, in a longitudinal direction of the long film. This makes it possible to form an orientation angle in the long film F in such a manner that an angle defined between the orientation angle and a widthwise direction of the film has a cycle length of 10 mm to less than 1500 mm in a longitudinal direction of the film, wherein an amplitude of the angle in the cycle length cyclically changes in the longitudinal direction in the range of 0.2° to 1.0°.

The temperature of the high-temperature portion HT is not particularly limited, but may be set, for example, to a temperature greater than the stretching temperature by 5 to 50° C. On the other hand, the temperature of the low-temperature portion LT is not particularly limited, but may be set, for example, to a temperature less than the stretching temperature by 5 to 30° C.

However, it should be noted that the low temperature in the low-temperature portion LT means a temperature relative to the temperature of the high-temperature portion HT, i.e., does not necessarily mean a temperature less than the stretching temperature. It should also be noted that the high temperature in the high-temperature portion HT means a temperature relative to the temperature of the low-temperature portion LT, i.e., does not necessarily mean a temperature greater than the stretching temperature. That is, in addition to the case where the temperature of the high-temperature portion HT is set to be greater than the stretching temperature and the temperature of the low-temperature portion LT is set to be less than the stretching temperature, as mentioned above, the temperature of either one of the two portions may be set to be approximately equal to the stretching temperature, or the temperatures of both of the two portions may be set to be greater or less than the stretching temperature.

Further, this embodiment discloses as an example the configuration in which the high-temperature portion HT and the low-temperature portion LT are formed in eight equally-divided regions in an alternate arrangement as illustrated in FIG. 6(b). However, the configuration of the roll Ra usable in this embodiment is not limited thereto. That is, the roll Ra may be configured such that the high-temperature portion HT and the low-temperature portion LT are formed, respectively, in two equally-divided regions thereof, or may be formed to have eight or more equally-divided regions. Alternatively, it may be produced to have unequally-divided regions. For example, the high-temperature portion HT may be larger than the low-temperature portion LT, and adjusted to allow the high-temperature portion HT to be pressed against the long film F for a longer time, as compared to the low-temperature portion LT. Further, the roll Ra may be produced to have a configuration in which a portion adjusted to have a temperature equal to the stretching temperature is newly provided, and the resulting three portions having different temperatures are alternately formed.

The number of the rolls Ra is not particularly limited, but may be one or two or more.

An installation position of the roll Ra is not particularly limited. For example, a configuration as illustrated in FIG. 6(a) may be employed, wherein two sets of three rolls Ra are provided, respectively, on upper and lower sides of the long film F being conveyed, and pressed against the long film F, respectively, from thereabove and therebelow. Alternatively, the roll(s) Ra may be installed on only one of the lower and upper sides of the long film F. In the case where a pair of rolls Ra are pressed against the long film F being conveyed, respectively, from thereabove and therebelow, it is preferable that temperatures of the rolls Ra pressed from above and below the long film F are coincident with each other. That is, the pair of rolls Ra are preferably configured such that, when the high-temperature portion HT of one of the rolls Ra is pressed against the long film F from thereabove, the high-temperature portion HT of the other roll Ra is simultaneously pressed against the long film F from therebelow.

This embodiment discloses as an example the configuration in which the roll Ra is directly pressed against the long film F being conveyed, as illustrated in FIG. 6(a). However, a usage mode of the roll Ra usable in this embodiment is not limited thereto. That is, the roll Ra may be installed at a position spaced apart from the long film F, to impart a temperature difference along the longitudinal direction of the long film F by means of radiation heat from the roll Ra. In this case, it is preferable that the roll Ra is installed in such a manner as to be rotatable in synchronization with the long film F being conveyed.

Figure 7:
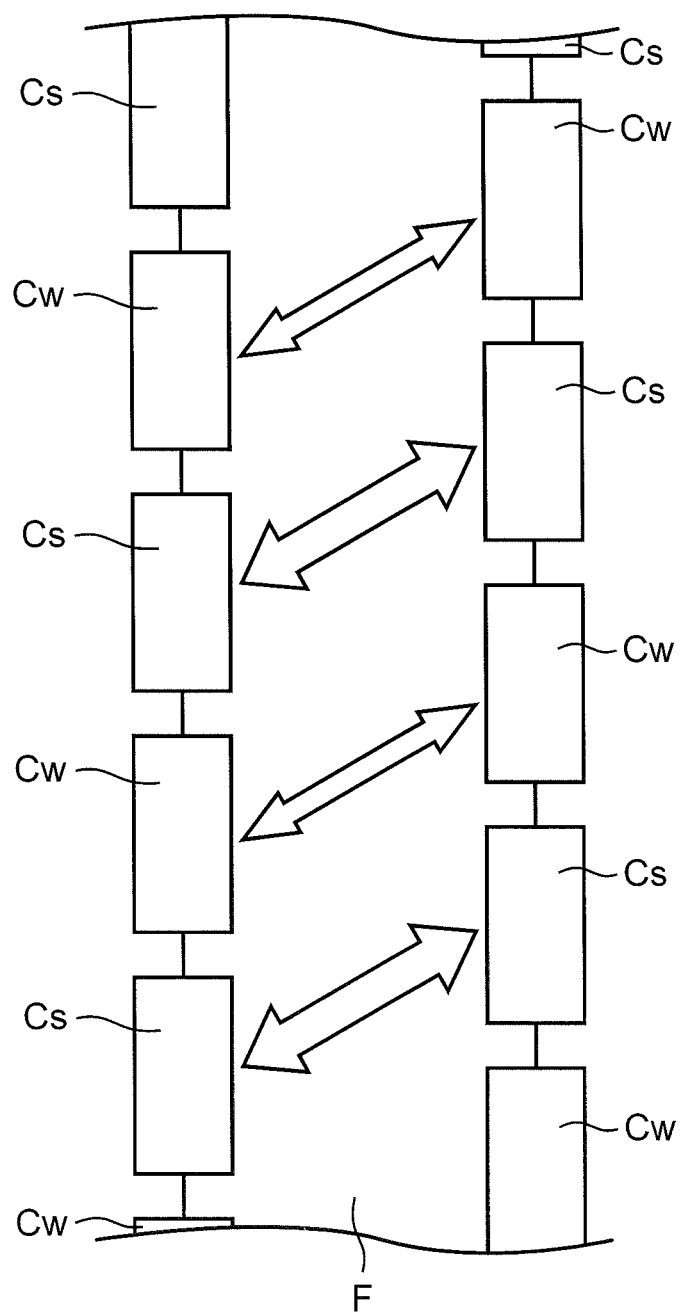
FIG. 7 is a schematic diagram illustrating a technique of adjusting a holding force of a gripper along a longitudinal direction of a long film being conveyed.

FIG. 7 is a schematic diagram illustrating a technique of adjusting a holding force of a gripper along a longitudinal direction of a long film F being conveyed.

As illustrated in FIG. 7, among a plurality of pairs of grippers holding a long film F being conveyed, a difference in level (strength/weakness) of stress between the pair of grippers (inter-gripper stress) is provided. This makes it possible to form an orientation angle in the long film F in such a manner that an angle defined between the orientation angle and a widthwise direction of the film has a cycle length of 10 mm to less than 1500 mm in a longitudinal direction of the film, wherein an amplitude of the angle in the cycle length cyclically changes in the longitudinal direction in the range of 0.2° to 1.0°. In FIG. 7, each of a pair of grippers (gripper pair) configured to hold the long film F by a strong inter-gripper stress is indicated by the reference sign Cs, each of a pair of grippers (gripper pair) configured to hold the long film F by a weak inter-gripper stress is indicated by the reference sign Cw.

A technique of weakening and strengthening the inter-gripper stress is not particularly limited. For example, as means to weaken the inter-gripper stress, it is possible to employ a technique of adjusting a holding position of each of the pair of grippers to hold the film at a position closer to a lateral edge of the film than a normal holding position, to thereby provide a reduced stretching ratio as compared to a predetermined value. Further, as means to strengthen the inter-gripper stress, it is possible to employ a technique of adjusting the holding position to hold the film at a position closer to a center of the film than the normal holding position, to thereby provide an increased stretching ratio as compared to the predetermined value. It is also possible to employ a technique of setting a difference in level of a spring constant of the gripper to provide a difference in level of the inter-gripper stress.

It should be noted that the difference in level of the inter-gripper stress means a relative difference in the inter-gripper stress between the gripper pair Cs and the gripper pair Cw. Thus, the inter-gripper stress of the gripper pair Cs may be set to be approximately equal to a normal inter-gripper stress by which a conventional gripper pair holds the long film F, and the inter-gripper stress of the gripper pair Cw may be set to be less than the inter-gripper stress of the gripper pair Cs. Alternatively, the inter-gripper stress of the gripper pair Cw may be set to be approximately equal to a normal inter-gripper stress by which a conventional gripper pair holds the long film F, and the inter-gripper stress of the gripper pair Cs may be set to be greater than the inter-gripper stress of the gripper pair Cw.

This embodiment discloses as an example the configuration in which the gripper pair Cs and the gripper pair Cw alternately travel, as illustrated in FIG. 7. However, a traveling order of the gripper pairs usable in this embodiment is not limited thereto. For example, the stretching apparatus may be configured such that three types of gripper pairs including a gripper pair capable of providing the normal inter-gripper stress alternately travel.

Further, this embodiment discloses as an example the configuration in which two grippers making up a gripper pair have the same holding force, as illustrated in FIG. 7. However, a combination of two grippers making up a gripper pair usable in this embodiment is not limited thereto. That is, a gripper having a nominal holding force (gripper C) and a gripper Cs having a holding force greater than the normal holding force may be paired to form a gripper pair (represented as "C-Cs"), or a gripper having a normal holding force and a gripper Cw having a holding force less than the normal holding force may be paired to form a gripper pair (represented as "C-Cw"). More specifically, for example, a plurality of gripper pairs may be formed along the longitudinal direction of the long film in the following order: C-C, C-Cs, Cw-Cs, Cw-C, C-C, Cs-C, Cs-Cw, C-Cw, C-C. This makes it possible to form an orientation angle whose amplitude cyclically changes more shortly along the longitudinal direction of the long film F.

In this embodiment, according to need, with a view to adjusting mechanical properties and optical properties of the film, transverse stretching and longitudinal stretching may be performed in a step before or after the long film is introduced into the oblique stretching apparatus.

As regards a temperature of each zone, based on a glass transition temperature Tg of the thermoplastic resin, the temperature of the preheating zone, the temperature of the stretching zone and the temperature of the cooling zone are set, respectively, to Tg to Tg+30° C., Tg to Tg+30° C. and Tg−30° C. to Tg A stretching ratio in the stretching step is preferably 1.3 to 3.0 times, more preferably, 1.5 to 2.8 times. When the stretching ratio is set in this range, thickness unevenness in the widthwise direction is desirably reduced.

(Steps Other than Oblique Stretching Step)

Next, other steps employable in this embodiment will be described. It should be noted that the production method in this embodiment may comprise at least the aforementioned oblique stretching step, and a winding step of winding the obliquely-stretched film from the oblique stretching step, into a roll shape, and other steps are not particularly limited. Thus, the following other steps will be described by way of illustration, and design changes may be appropriately made therein.

(Film Forming Step of Long Film)

A film forming step is a step of forming a long film comprising a thermoplastic resin.

The long film to be formed in this embodiment is not particularly limited, but may be any long film comprised of the aforementioned thermoplastic resin. Among thermoplastic resins, from the viewpoint of transparency, mechanism strength and others, it is possible to desirably employ a polycarbonate-based resin, an olefin polymer-based resin having an alicyclic structure and a cellulose ester-based resin.

As a method for forming a long film using the polycarbonate-based resin or the olefin polymer-based resin (e.g., norbornene-based resin), it is possible to desirably employ a production method based on a melt extrusion process or a solution film-forming process. Further, a cellulose ester-based resin film can be formed by a heretofore-known method. In particular, it is preferable to employ a solution casting process and melt casting process.

<Melt Extrusion Process>

Examples of the melt extrusion process include an inflation process using a die. In this case, it is preferable to use a T-die, because it is excellent in productivity and thickness accuracy. An extrusion molding process using a T-die is capable of producing a long film having a small variation of optical properties such as retardation and orientation angle by a technique of allowing a thermoplastic resin in a molten state to be kept in a stable state during an operation of bringing the resin into close contact with a cooling drum, as described in JP 2004-233604 A.

Specific examples thereof include 1) a technique of, during production of a long film by the melt extrusion process, taking up a sheet-shaped thermoplastic resin extruded from a die, while bringing the resin into close contact with a cooling drum under a pressure of 50 kPa or less; 2) a technique of, during production of a long film by the melt extrusion process, covering by an enclosure member a region from a die opening to a first-contactable cooling drum, and setting a distance between the enclosure member and the die opening or the first-contactable cooling drum to 100 mm or less; 3) a technique of, during production of a long film by the melt extrusion process, heating an atmosphere within 10 mm from a sheet-shaped thermoplastic resin extruded from a die opening, up to a specific temperature; 4) a technique of taking up a sheet-shaped thermoplastic resin extruded from a die in a manner satisfying a given relationship, while bringing the resin into close contact with a cooling drum under a pressure of 50 kPa or less; and 5) a technique of, during production of a long film by the melt extrusion process, blowing air against a sheet-shaped thermoplastic resin extruded from a die opening, at a speed different from a taking-up speed of a first-contactable cooling drum by 0.2 m/s or less.

<Solution Casting Method>

The solution casting method is preferable from the viewpoint of suppressing coloration of a film, foreign substance defects and optical defects such as a die line, and providing flatness and transparency of a film.

(Organic Solvent)

Examples of an organic solvent useful to form a dope, for example, examples of a chlorine-based organic solvent may include methylene chloride, and examples of a chlorine-free organic solvent may include methyl acetate, ethyl acetate, amyl acetate, acetone, tetrahydrofuran, 1,3-dioxolane, 1,4-dioxane, cyclohexanone, ethyl formate, 2,2,2-trifluoroethanol, 2,2,3,3-hexatetrafluoro-1-propanol, 1,3-difluoro-2-propanol, 1,1,1,3,3,3-hexafluoro-2-methyl-2-propanol, 1,1,1,3,3,3-hexafluoro-2-propanol, 2,2,3,3,3-pentafluoro-1-propanol, and nitroethane, and it is possible to desirably use methylene chloride, methyl acetate, ethyl acetate and acetone.

Preferably, the dope contains a straight-chain or branched-chain aliphatic alcohol having a carbon number of 1 to 4 in an amount of 1 to 40 mass %, in addition to the above organic solvent.

Examples of the straight-chain or branched-chain aliphatic alcohol having a carbon number of 1 to 4 may include methanol, ethanol, n-propanol, iso-propanol, n-butanol, sec-butanol and tert-butanol. Among them, ethanol is preferable from the viewpoint of dope stability, relative low boiling point, and good driability.

(Solution Casting)

The solution casting process is performed according to a step of preparing a dope by dissolving a resin and an additive in a solvent, a step of casting the dope onto a belt-shaped or drum-shaped metal support body, a step of drying the cast dope as a web, a step of peeling the web from the metal support body, a step of stretching or keeping a width, a step of further drying and a step of winding a finished long obliquely-stretched film.

Preferably, the metal support body in the casting step has a specular-finished surface. As the metal support body, it is possible to desirably use a stainless steel belt or a drum having a surface plated by cast metal.

A surface temperature of the metal support body in the casting step is set in the range of −50° C. to a temperature at which the solvent does not undergo boiling and bubble release. A higher temperature is desirable because it can provide a higher drying speed of the web. However, an excessively high temperature is likely to cause the web to undergo bubble release, resulting in degradation in flatness.

The temperature of the support body is preferably set in a range of 0 to 100° C., more preferably, 5 to 30° C., on a case-by-case basis. Further, it is also preferable to employ a technique of cooling the web to undergo gelation, and peel the gelled web from the drum in a situation where it contains a large amount of residual solvent. A technique of controlling the temperature of the metal support body is not particularly limited. Examples thereof include a technique of blowing hot or cold air, and a technique of bringing hot water into contact with a back side of the metal support body. It is preferable to use hot water, from the view point of allowing efficient heat transfer to thereby shorten a time required for the metal support body to have a constant temperature.

In the case of employing hot air, considering lowering in temperature of the web due to latent heat of evaporation of the solvent, the hot air can be used at a temperature equal to or greater than a boiling point of the solvent and greater than a target temperature, while preventing bubble release.

Particularly, it is preferable to efficiently perform drying by changing the temperature of the support body and the temperature of the drying air during a period from the casting to the peeling.

In order to allow an obtained resin film to exhibit good flatness, an amount of residual solvent at the time when the web is peeled from the metal support body is preferably 10 to 150 mass %, more preferably, 20 to 40 mass % or 60 to 130 mass %, particularly preferably, 20 to 30 mass % or 70 to 120 mass %.

The amount of residual solvent is defined by the following formula:

$$\text{Amount of residual solvent (mass \%)} = \{(M-N)/N\} \times 100,$$

where M represents a mass of a sample collected at an arbitrary time point during or after production of the web or the long film, and N represents a mass after heating the M at 115° C. for 1 hour.

Further, in the resin film drying step, the web is peeled from the metal support body and further dried so that the amount of residual solvent is preferably reduced to 1 mass % or less, more preferably, 0.1 mass % or less, particularly preferably, 0 to 0.01 mass %.

Generally, the film drying step employs a roll drying process (process of drying a web by causing the web to alternately pass through a plurality of rolls arranged in an up-down direction), and a process of drying a web while conveying the web by a tenter system.

<Melt Casting Process>

A melt casting process is a preferred film formation method, from the viewpoint that it makes it easier to reduce a retardation Rt in a thickness direction after oblique stretching, and can reduce an amount of residual volatile component to provide excellent dimensional stability of a film. The melt casting process means heating a composition comprising a resin and an additive such as a plasticizer to a temperature causing the composition to exhibit fluidity so as to melt the composition and then casting a resulting melt. A process based on the melt casting can be classified into a melt extrusion molding process, a press molding process, an inflation process, an injection molding process, a blow molding process, a stretching molding process and others. Among them, the melt extrusion process is preferable from the viewpoint of obtaining a long film having excellent mechanical strength and surface accuracy or the like.

Generally, it is preferable that a plurality of raw materials for use in the melt extrusion process are preliminarily kneaded and pelletized.

Additives may be mixed before being supplied to an extruder, or may be supplied by independent feeders, respectively.

Preferably, small amounts of additives such as particles and an antioxidant are preliminarily mixed in the resin to ensure uniform mixing.

Preferably, the extruder is configured to process a resin at the lowest temperature allowing pelletizing, so as to suppress sharing force and prevent degradation of the resin (reduction in molecular weight, staining, gelation, etc.). For example, in a twin-screw extruder, it is preferable to use deep-groove screws configured to be rotated in the same direction. In view of uniformity in kneading, an intermeshing type is preferable.

Film-formation is performed using the pellets obtained in the above manner. It is to be understood that the film-formation may be performed just after a powder of raw materials is directly put into a feeder without being pelletized.

A melting temperature during extrusion of the pellets by using a single-screw or twin-screw extruder is set in the range of about 200 to 300° C. A resulting melt is filtrated using a leaf disk-type filter or the like to remove foreign substances therefrom, and cast from a T-die to have a form-like shape. Then, a resulting film is nipped between a cooling roll and an elastic touch roll, and solidified on the cooling roll.

Preferably, introduction from a feed hopper into the extruder is performed under vacuum or under reduced pressure or under an inert gas atmosphere, to thereby prevent oxidation, decomposition or the like.

Preferably, an extrusion flow rate is stabilized, for example, by means of introduction of a gear pump. As the filter for removing foreign substances, a sintered stainless steel fiber filter is preferably used. The sintered stainless steel fiber filter is obtained by: forming stainless steel fibers into a complicatedly tangled state; compressing the stainless steel fibers; and sintering contact portions of the compressed stainless steel fibers to integrate them together, wherein filtration accuracy can be adjusted by changing density of the fibers based on fiber diameter and compression amount.

The additives such as a plasticizer and particles may be preliminarily mixed with the resin, or may be kneaded into the resin in the course of the extrusion. For uniform addition, it is preferable to use a mixing device such as static mixer.

Preferably, a film temperature on the side of the touch roll during nipping of the film between the cooling roll and the elastic touch roll is set in the range of Tg of the film to Tg+110° C. As an elastic touch roll having an elastic surface usable for such a purpose, a heretofore-known roll may be used.

The elastic touch roll is also referred to as "nipping rotor". As the elastic touch roll, a commercially-available product may be used.

It is preferable to control a tension of the long film during peeling from the cooling roll, to prevent deformation of the long film.

The long film may be a single-layered film or a multi-layered laminate film. The laminated film can be obtained by a heretofore-known method such as a co-extrusion molding process, a co-casting molding process, a film lamination process and a coating process. Among them, the co-extrusion process method and the co-casting molding process are preferable.

The long film formed by the above process is conveyed to the aforementioned stretching apparatus and stretched in an oblique direction.

A thickness of the long film is preferably 20 to 400 μm, more preferably, 30 to 200 μm.

In this embodiment, a thickness unevenness nm in a flow direction of the long film supplied to the stretching zone is less than 0.30 μm, preferably, less than 0.25 μm, further preferably, less than 0.20 μm, from the viewpoint of maintaining a taking-up tension of the long film constant at the inlet of the aforementioned oblique stretching apparatus and stabilizing optical properties such as orientation angle and retardation. If the thickness unevenness nm in the flow direction of the long film is 0.30 μm or more, variations of optical properties of the long obliquely-stretched film such as the retardation and orientation angle significantly deteriorate.

As the long film, a long film having a thickness gradient in the widthwise direction may be supplied. The thickness gradient of the long film can be empirically obtained by experimentally stretching a large number of long films having various thickness gradients in such a manner as to maximally uniform a film thickness in a position where stretching in a subsequent step has been completed. For example, the thickness gradient of the long film can be adjusted such that a longitudinal end of a large-thickness side has a thickness greater than a longitudinal end of a small-thickness side by about 0.5 to 3% of the thickness of the small-thickness side.

A preferred elastic modulus at the stretching temperature during oblique stretching of the long film is in the range of 0.01 MPa to 5000 MPa, more preferably, 0.1 MPa to 500 MPa, in terms of Young's modulus. If the elastic modulus is excessively low, a shrinkage ratio during/after stretching decreases, so that wrinkles are likely to remain. On the other hand, if the elastic modulus is excessively high, a tension applied during stretching increases, so that it become necessary to increase strength of a portion for holding opposite lateral ends of the long film, resulting in increase of a load applied to the tenter in the subsequent step.

As the long film, a non-oriented long film may be used, or a preliminarily-oriented long film may be supplied. Further, according to need, a widthwise distribution of orientation of the long film may have an arched shape or so-called "bowing". The point is that a state of orientation of the long film may be adjusted to provide a desired orientation of the long obliquely-stretched film in a position where stretching in the subsequent step has been completed.

(Oblique Stretching Step)

The oblique stretching step is as already mentioned above. The long obliquely-stretched film from the oblique stretching step is obliquely stretched in a direction defining an angle of greater 0° to less than 90° with respect to the widthwise direction of the long film. The stretched long obliquely-stretched film is wound in a subsequent winding step.

(Winding Step)

The winding step is a step of winding the long obliquely-stretched film from the oblique stretching step into a roll shape. A winding apparatus used in the winding step is provided at the exit of the oblique stretching apparatus. The winding apparatus is disposed to take up the long obliquely-stretched film at a given angle with respect to the stretching apparatus, so that it can finely control a taking-up position and a taking-up angle of the long obliquely-stretched film, to wind the long obliquely-stretched film having small variations of the film thickness and optical values, into a roll shape. Thus, it becomes possible to effectively prevent the occurrence of wrinkles in the long obliquely-stretched film, and enhance winding performance of the long obliquely-stretched film, whereby the long film after stretching can be wound in longer length. In this embodiment, a taking-up tension T (N/m) of the long film after stretching is adjusted in a range of 100 N/m<T<300 N/m, preferably, 150 N/m<T<250 N/m.

As mentioned above, the long obliquely-stretched film according to the aforementioned embodiment an orientation angle formed such that an angle defined between the orientation angle and a widthwise direction of the film has a cycle length of 10 mm to less than 1500 mm in a longitudinal direction of the film, wherein an amplitude of the angle in the cycle length cyclically changes in the longitudinal direction in the range of 0.2° to 1.0°. In this case, when the taking-up tension is adjusted in the above manner, winding displacement is particularly suppressed.

If the taking-up tension is equal to or less than 100 N/m, slack and/or wrinkles are more likely occur in the long obliquely-stretched film, and a profile of the orientation axis in the widthwise direction also tends to deteriorate. On the other hand, if the taking-up tension is equal to or greater than 300 N/m, variation of the orientation angle in the widthwise direction deteriorates, so that width yield (utilization efficiency in the widthwise direction) tends to undesirably deteriorates.

In this embodiment, it is preferable to control a fluctuation of the taking-up tension T with an accuracy of less than ±5%, preferably, less than ±3%. If the fluctuation of the taking-up tension T is equal to or greater than ±5%, variations of optical properties in the widthwise direction and flow direction increase. Examples of means to control the fluctuation of the taking-up tension T to fall within the above range include a technique of measuring a load applied to the first roll with respect to the exit of the tenter, i.e. a tension of the long obliquely-stretched film, and controlling a rotational speed of a taking-up roll in such a manner as to maintain a value of the load constant by a commonly-used PID control method. Examples of means to measure the load includes a technique of mounting a load cell onto a bearing of the roll to measure a load applied to the roll, i.e. a tension of the long obliquely-stretched film. As the load cell, it is possible to employ a heretofore-known tension or compression type.

After the long obliquely-stretched film is released from holding by the grippers, and discharged from the exit of the tenter, it can be sequentially wound around a winding core (winding roll) to form a wound body.

It is desirable to trim the opposite lateral ends (opposite sides) of the long obliquely-stretched film in order to cut off gripper marks formed on the opposite sides of the long obliquely-stretched film held by the grippers, and/or obtain a desired width.

The trimming may be performed at once, or may be performed separately plural times.

According to need, after winding the long obliquely-stretched film once, the long obliquely-stretched film may be fed again to trim the opposite ends thereof, and then wound again to form a roll-shaped wound body of the long obliquely-stretched film.

The wound body wound into a roll shape may be appropriately stored. Storage conditions are not particularly limited. For example, it is preferable to store the wound body it in a space in which temperature and humidity are stably controlled, for example, in the range of about 20 to 25° C. and in the range of about 40 to 60% RH, respectively. However, due to disturbances such as weather and transportation method, there is a situation where the wound body is placed in an environment departing from the above ranges. A storage method requires only easiness to store and extract. For example, the wound body may be stored by, after placing the wound body on a metal or resin rack in a posture lying on its side, and a plurality of the racks are laid out in horizontal and vertical directions, or stacked up.

Technical features of the above long obliquely-stretched film will be outlined below.

According to one or more aspects of the present invention, there is provided a long obliquely-stretched film wound into a roll shape. The long obliquely-stretched film comprises a thermoplastic resin and has an orientation angle formed such that an angle defined between the orientation angle and a widthwise direction of the film has a cycle length of 10 mm to less than 1500 mm in a longitudinal direction of the film, wherein an amplitude of the angle in the cycle length cyclically changes in the longitudinal direction in the range of 0.2° to 1.0°.

The long obliquely-stretched film of one or more embodiments of the present invention has an orientation angle formed such that an angle defined between the orientation angle and a widthwise direction of the film has a cycle length of 10 mm to less than 1500 mm in a longitudinal direction of the film, wherein an amplitude of the angle in the cycle length cyclically changes in the longitudinal direction in the range of 0.2° to 1.0°, so that it becomes possible to suppress the occurrence of winding displacement when it is wound into a roll shape. In addition, when an obtained wound body is subjected to long-term storage, sticking between contact regions of the film and a concavity of the film are less likely to occur. Therefore, the long obliquely-stretched film of one or more embodiments of the present invention can suppress changes of optical properties during storage, and suppress the occurrence of color unevenness even when it is used in a circularly polarizing plate for use in an extremely high-contrast image display device such as an organic EL display.

Preferably, the long obliquely-stretched film of one or more embodiments of the present invention has a longitudinal length of 1000 m or more.

This long obliquely-stretched film has an orientation angle whose amplitude cyclically changes, as mentioned above, so that, even when a film having a long length of 1000 m or more is wound into a roll shape to form a wound body, the winding displacement is less likely to occur. Thus, when the obtained wound body is subjected to long-term storage, sticking between contact regions of the film and a concavity of the film are less likely to occur. This makes it possible to suppress changes of optical properties during storage, and suppress the occurrence of color unevenness even when used in a circularly polarizing plate for use in an extremely high-contrast image display device such as an organic EL display.

Preferably, the long obliquely-stretched film of one or more embodiments of the present invention has a film thickness of 10 to 80 μm.

As long as the film thickness falls within this range, the long obliquely-stretched film not only exhibits excellent mechanical strength but also suppresses winding displacement when it is wound into a roll shape. Thus, when the obtained wound body is subjected to long-term storage, sticking between contact regions of the film and a concavity of the film are less likely to occur. This makes it possible to suppress changes of optical properties during storage, and suppress the occurrence of color unevenness even when used in a circularly polarizing plate for use in an extremely high-contrast image display device such as an organic EL display.

Preferably, the long obliquely-stretched film of one or more embodiments of the present invention has a widthwise length of 500 mm or more.

This long obliquely-stretched film has an orientation angle whose amplitude cyclically changes, as mentioned above, so that, even when a film having a width of 500 mm or more is wound, the winding displacement is less likely to occur. Thus, when an obtained wound body is subjected to long-term storage, sticking between contact regions of the film and a concavity of the film are less likely to occur. This makes it possible to suppress changes of optical properties during storage, and suppress the occurrence of color unevenness even when used in a circularly polarizing plate for use in an extremely high-contrast image display device such as an organic EL display.

The long obliquely-stretched film of one or more embodiments of the present invention can be adequately produced even using a long film comprising a thermoplastic resin and having a photo-elastic coefficient of $1.0 \times 10^{-11}$ to $1.0 \times 10^{-10}$ ($Pa^{-1}$) before the oblique stretching.

This long obliquely-stretched film can suppress winding displacement even after long-term storage. Thus, even in a situation where the long obliquely-stretched film obtained by obliquely stretching a long film having a photoelastic coefficient falling within the above range is subjected to long-term storage, it becomes possible to suppress deformation due to winding displacement to allow the long obliquely-stretched film to be suitably used as an optical film.

In the long obliquely-stretched film of one or more embodiments of the present invention, a polycarbonate-based resin can be suitably used as the thermoplastic resin.

In the case where the thermoplastic resin constituting the long obliquely-stretched film is a polycarbonate-based resin, sensitivity of a change in in-plane retardation to deformation of the film is large, so that the in-plane retardation of the film is likely to vary due to winding displacement and/or winding tightening. However, even in this case, one or more embodiments of the present invention can desirably bring out a great effect.

According to one or more aspects of the present invention, there is provided a circularly polarizing plate which is produced using the above long obliquely-stretched film.

This circularly polarizing plate is produced using the above long obliquely-stretched film having an orientation angle whose amplitude cyclically changes, so that, even when the circularly polarizing plate laminated to an organic EL display, it becomes possible to bring out excellent effect of enhancing contrast, and suppress the occurrence of color unevenness.

According to one or more aspects of the present invention, there is provided an organic EL display which is produced using the above circularly polarizing plate.

The organic EL display is produced using the above long obliquely-stretched film having an orientation angle whose amplitude cyclically changes, so that it becomes possible to particularly enhance contrast, and suppress the occurrence of color unevenness.

Inventive Examples

Embodiments of the present invention will be specifically described by way of the following Inventive Examples. It is to be understood that the present invention is not limited thereto.

<Production of Long Film>

In the film forming step, long films A to C were produced in the following manner.

(Long Film A)

The long film A was a polycarbonate-based film and produced by the following production method.

<Dope Composition>

| | |
|---|---|
| Polycarbonate resin (viscosity average molecular weight: 40,000, bisphenol A type) | 100 mass parts |
| 2-(2'hydroxy-3',5'-di-t-butylphenyl)-benzotriazol | 1.0 mass part |
| Methylene chloride | 430 mass parts |
| Methanol | 90 mass parts |

The above composition was put in a sealed container, and completely dissolved under stirring, while being kept at a temperature of 80° C. under pressure, to thereby obtain a dope composition.

Subsequently, this dope composition was filtered and cooled and maintained at 33° C., whereafter the cooled dope composition was uniformly cast onto a stainless steel band, and dried at 33° C. for 5 minutes. Then, a time of drying was adjusted to attain a retardation of 5 nm at 65° C., and a film peeled from the stainless steel band was completely dried while being conveyed by a large number of rolls, to obtain, as the long film A, a film having a film thickness of 85 μm, a width of 1000 mm and a photo-elastic coefficient of $2.5 \times 10^{-10}$ ($Pa^{-1}$).

(Long Film B)

The long film B was a cycloolefin-based resin film and produced by the following production method.

1.2 mass parts of 1-hexane, 0.15 mass parts of dibutyl ether and 0.30 mass parts of triisobutylaluminum were put in a reactor and mixed with 500 mass parts of dehydrated cyclohexane at room temperature in a nitrogen atmosphere, and then a norbornene-based monomer mixture comprising 20 mass parts of tricyclo[4.3.0.1 2,5]deca-3,7-diene (dicyclopentadiene: hereinafter abbreviated as "DCP"), 140 mass parts of 1,4-methano-1,4,4a,9a-tetrahydrofluorene (hereinafter, abbreviated as "MTF") and 40 mass parts of 8-methyltetracyclo[4.4.0.1 2,5.1 7,10]-dodeca-3-ene (hereinafter, abbreviated as "MTD"), and 40 mass parts of tungsten hexachloride (0.7% toluene solution), were continuously added and polymerized by taking 2 hours, while being kept at 45° C. 1.06 mass parts of butyl glycidyl ether and 0.52 mass parts of isopropyl alcohol were added to the polymerization solution to inactivate a polymerization catalyst and stop the polymerization reaction.

Subsequently, 270 mass parts of cyclohexane was added to 100 mass parts of the obtained reaction solution containing a ring-opening polymer, and 5 mass parts of nickel-alumina catalyst (produced by JGC C&C) as a hydrogenation catalyst was further added. The resulting solution was pressurized to 5 MPa by hydrogen and heated to 200° C. under stirring, to induce reaction for 4 hours to thereby obtain a reaction solution containing 20% of DCP/MTF/MTD ring-opening polymer hydrogenated polymer.

The hydrogenation catalyst was removed by filtering, and then each of soft polymer (produced by Kuraray Co., Ltd.; Septon 2002) and antioxidant (produced by Ciba Specialty Chemicals; Irganox 1010) was added to and dissolved in the obtained solution (in an amount of 0.1 mass parts per 100 mass parts of the polymer). Subsequently, cyclohexane as a solvent and other volatile components were removed from the solution using a cylindrical concentration dryer (produced by Hitachi Ltd.). The hydrogenated polymer was extruded from an extruder in a molten state in the form of a strand, and formed into pellets and collected after being cooled. A copolymerization ratio of each norbornene-based monomer in the polymer was calculated from a composition of norbornenes remaining in the solution after polymerization (by a gas chromatography method). As a result of the calculation, DCP/MTF/MTD=10/70/20 which was substantially equal to a composition for preparation. A weight-average molecular weight (Mw) of this ring-opening polymer hydrogenated product was 31,000, a molecular distribution (Mw/Mn) thereof was 2.5, a hydrogenation rate thereof was 99.9% and Tg thereof was 134° C.

The obtained pellets of the ring-opening polymer hydrogenated product were dried at 70° C. for 2 hours to remove moisture using a hot air dryer configured to allow air to pass therethrough. Subsequently, the pellets were subjected to melt extrusion to form a cycloolefin polymer film having a thickness of 75 μm by using a single-screw extruder (produced by Mitsubishi Heavy Industries, Ltd., screw diameter: 90 mm, material of T-die lip: tungsten carbide, peel strength with respect to molten resin: 44 N) having a coat hanger type T-die. The extrusion molding was performed in a clean room with a class of 10,000 or less under molding conditions: a molten resin temperature of 240° C.; and a T-die temperature of 240° C., to obtain as the long film B, a film having a length of 1000 mm and a photo-elastic coefficient of $5.0 \times 10^{-12}$ $(Pa^{-1})$.

(Long Film C)
The long film C was a cellulose ester-based resin film and produced by the following production method.

<Fine Particle Dispersion Liquid>

| Fine particles (Aerosil R972V produced by Nippon Aerosil Co., Ltd.) | 11 mass parts |
| Ethanol | 89 mass parts |

The above were stirred and mixed for 50 minutes by a dissolver and then dispersed by a Manton-Gaulin homogenizer.

<Fine Particle Added Liquid>

Based on the following composition, the above fine particle dispersion liquid was slowly added into a dissolution tank containing methylene chloride while being sufficiently stirred. The dispersion liquid was further dispersed by an Attritor in such a manner as to allow secondary particles to have a given particle size. The resulting dispersion liquid was filtered using a Fine Met NF produced by Nippon Seisen Co., Ltd., to prepare a fine particle added liquid.

| Methylene chloride | 99 mass parts |
| Fine particle-dispersed liquid 1 | 5 mass parts |

<Main Dope Solution>

A main dope solution having the following composition was prepared. First of all, methylene chloride and ethanol were added into a pressure dissolution tank. Cellulose acetate was put in the pressure dissolution tank containing a solvent, under stirring. The resulting mixture was heated and completely dissolved under stirring, whereafter the resulting solution was filtered using Azumi Filter Paper No. 244 produced by Azumi Filter Paper Co., Ltd. to prepare the main dope solution. As a sugar ester compound and an ester compound, compounds synthesized by the following synthesis examples were used. Further, as a compound (B), the following compound was used.

<Composition of Main Dope Solution>

| Methylene Chloride | 340 mass parts |
| Ethanol | 64 mass parts |
| Cellulose acetate propionate (acetyl group substitution degree: 1.39, propionyl group substitution degree: 0.50, total substitution degree: 1.89) | 100 mass parts |
| Compound (B) | 5.0 mass parts |
| Sugar ester compound | 5.0 mass parts |
| Ester compound | 2.5 mass parts |
| Fine particle added liquid 1 | 1 mass part |

(B)

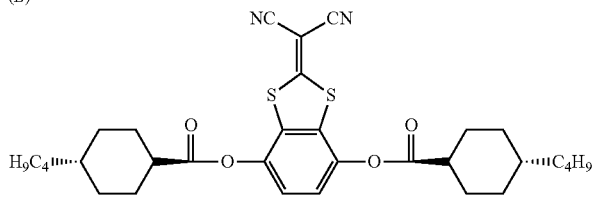

(Synthesis of Sugar Ester Compound)

The sugar ester compound was synthesized by the following steps.

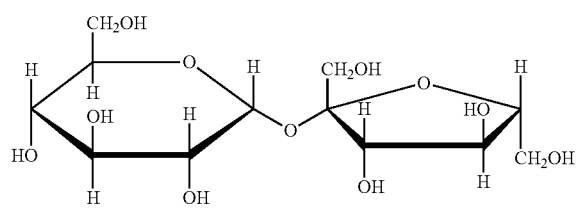 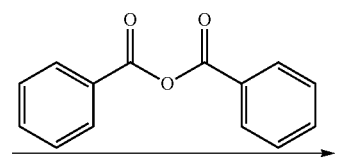

-continued

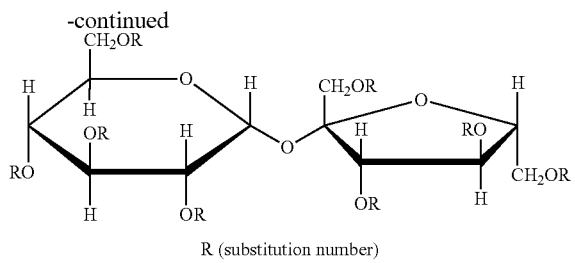

R (substitution number)

Exemplary Compound A-1

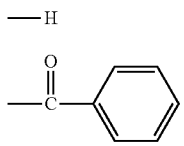

(0)
(8)

Exemplary Compound A-2

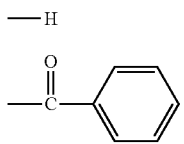

(1)
(7)

Exemplary Compound A-3

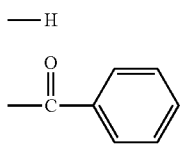

(2)
(6)

Exemplary Compound A-4

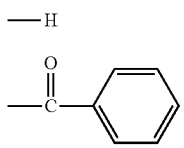

(3)
(5)

Exemplary Compound A-5

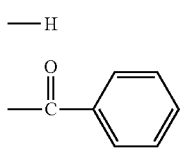

(4)
(4)

34.2 g (0.1 mol) of sucrose, 180.8 g (0.6 mol) of anhydrous benzoic acid, 379.7 g (4.8 mol) of pyridine were charged into a four-head flask provided with a stirring device, a reflux cooler, a thermometer and a nitrogen gas introduction pipe, and heated while nitrogen gas was bubbled from the nitrogen gas introduction pipe under stirring, to induce an esterification reaction at 70° C. for 5 hours.

Subsequently, an inside of the flask was decompressed to $4 \times 10^2$ Pa or less, and excess pyridine was distilled away at 60° C. Then, the inside of the flask was decompressed to $1.3 \times 10$ Pa or less, and heated up to 120° C. to thereby distill away most of anhydrous benzoic acid and produced benzoic acid.

Last of all, 100 g of water was added to a collected toluene layer, to wash the toluene layer with water at ambient temperature for 30 minutes. Then, the toluene layer was collected, and toluene was distilled away at 60° C. under decompression ($4 \times 10^2$ Pa or less) to obtain a mixture of compounds A-1, A-2, A-3, A-4 and A-5 (sugar ester compound).

The obtained mixture was analyzed by HPLC and LC-MASS. As a result of the analysis, contents of A-1, A-2, A-3, A-4 and A-5 were, respectively, 1.3 mass %, 13.4 mass %, 13.1 mass %, 31.7 mass % and 40.5 mass %. An average substitution degree was 5.5.

<Measurement Conditions of HPLC-MS>
1) LC Section
Device: column oven (JASCO CO-965), detector (JASCO UV-970-240 nm), pump (JASCO PU-980), degasser (JASCO DG-980-50) produced by Jasco Corporation
Column: Inertsil ODS-3, particle size of 5 μm, 4.6×250 mm (produced by GL Sciences Inc.)
Column Temperature: 40°
Flow velocity: 1 ml/min
Mobile Phase: THF (1% acetic acid): $H_2O$ (50:50)
Injection amount: 3 μL
2) MS Section
Device: LCQ DECA (Produced by Thermo Quest)
Ionization method: electrospray ionization (ESI) method
Spray voltage: 5 kV
Capillary temperature: 180° C.
Vaporizer temperature: 450° C.

(Synthesis of Ester Compound)

An ester compound was synthesized by the following steps.

251 g of 1,2-propylene glycol, 278 g of anhydrous phthalic acid, 91 g of adipic acid, 610 g of benzoic acid, 0.191 g of tetraisopropyl titanate as an esterification catalyst were charged into a 2 L four-mouth flask provided with a thermometer, a stirrer and a reflux cooling pipe and gradually heated up to 230° C. under steering in a nitrogen gas flow. A dehydration condensation reaction was induced for 15 hours and, after completion of the reaction, unreacted 1,2-propylene glycol was decompressed and distilled away at 200° C., to thereby obtain an ester compound. The ester compound had an ester of benzoic acid at an end of a polyester chain formed by the condensation of 1,2-propylene glycol, anhydrous phthalic acid and adipic acid. An acid number of the ester compound was 0.10 and a number average molecular weight thereof was 450.

Subsequently, using an endless belt casting apparatus, the ester compound was uniformly cast onto a stainless steel belt support.

In the endless belt casting apparatus, the above main dope solution was uniformly cast onto the stainless steel belt support. A solvent was evaporated on the stainless steel belt support until an amount of residual solvent in the cast long film became 75%. Then, the long film was peeled from the stainless steel belt support, and completely dried while being conveyed by a large number of rolls, to thereby obtain as the long film C, a film having a width of 1000 mm. The long film C at this time had a film thickness of 100 μm, and a photo-elastic coefficient of $2.0 \times 10^{-12}$ ($Pa^{-1}$).

The photo-elastic coefficient of each of the long films A to C was measured in the following manner.

Each of the obtained long films A to C was cut into a sample size of 30 mm×50 mm. The obtained sample having a film thickness d (nm) was pinched by a support device, and an stress a of $9.81 \times 10^6$ (Pa) was applied to the sample in its longitudinal direction by using a cell gap inspection device (RETS-1200 produced by Otsuka Electronics Co., Ltd., measurement diameter: φ 5 mm, light source: 589 nm). Under this stress, a retardation R1 (nm) was measured. Assuming that a retardation before application of the stress is RO (nm), RO was assigned to the following formula to derive a photo-elastic coefficient Cσ ($Pa^{-1}$)$_o$ $$C\sigma(Pa^{-1}) = (R1-RO)/(\sigma \times d)$$

<Production of Long Obliquely-Stretched Film>

Figure 8:
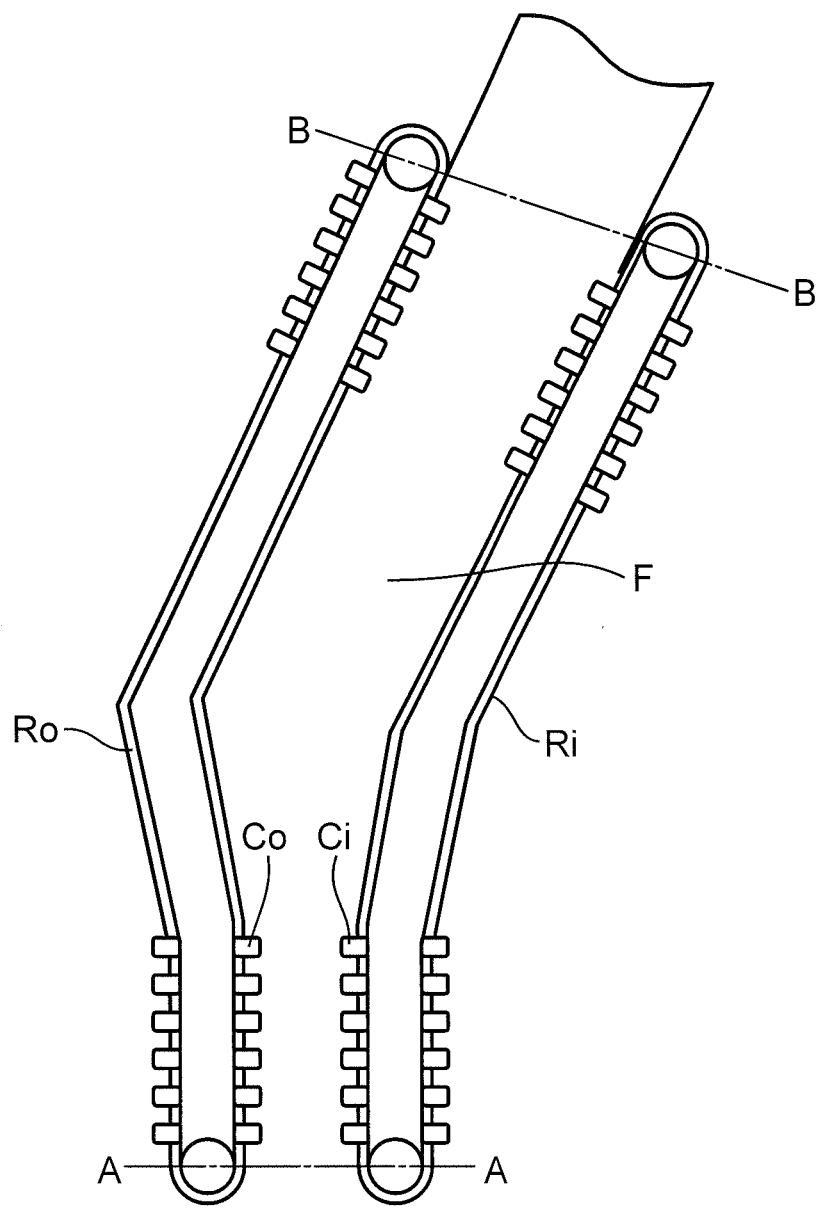
FIG. 8 is a schematic diagram illustrating a configuration of an oblique stretching apparatus for use in Inventive Examples and Comparative Examples.

Using the bending type oblique stretching apparatus illustrated in FIG. 8, each of the long films A to C was stretched to allow an orientation angle θ thereof to become 45° to produce a long obliquely-stretched film. FIG. 8 is a schematic diagram illustrating a configuration of the oblique stretching apparatus for use in Inventive Examples and Comparative Examples. A conveyance speed of the long film F was set to 25 in/min. The long obliquely-stretched film discharged from the stretching apparatus was subjected to edge trimming to adjust a film width of a final long obliquely-stretched film.

Inventive Example 1

Using the bending type oblique stretching apparatus T illustrated in FIG. 8, the long films A was stretched to allow an orientation angle θ thereof to become 45° to produce a long obliquely-stretched film. FIG. 8 is a schematic diagram illustrating a configuration of the oblique stretching apparatus T for use in Inventive Example 1. The conveyance speed of the long film F was set to 20 m/min. As temperature conditions of a tenter oven, a preheating zone, a stretching zone, a heat setting zone and a cooling zone were adjusted to be maintained at temperatures of 180° C., 180° C., 177° C. and 90° C., respectively.

Figure 9:
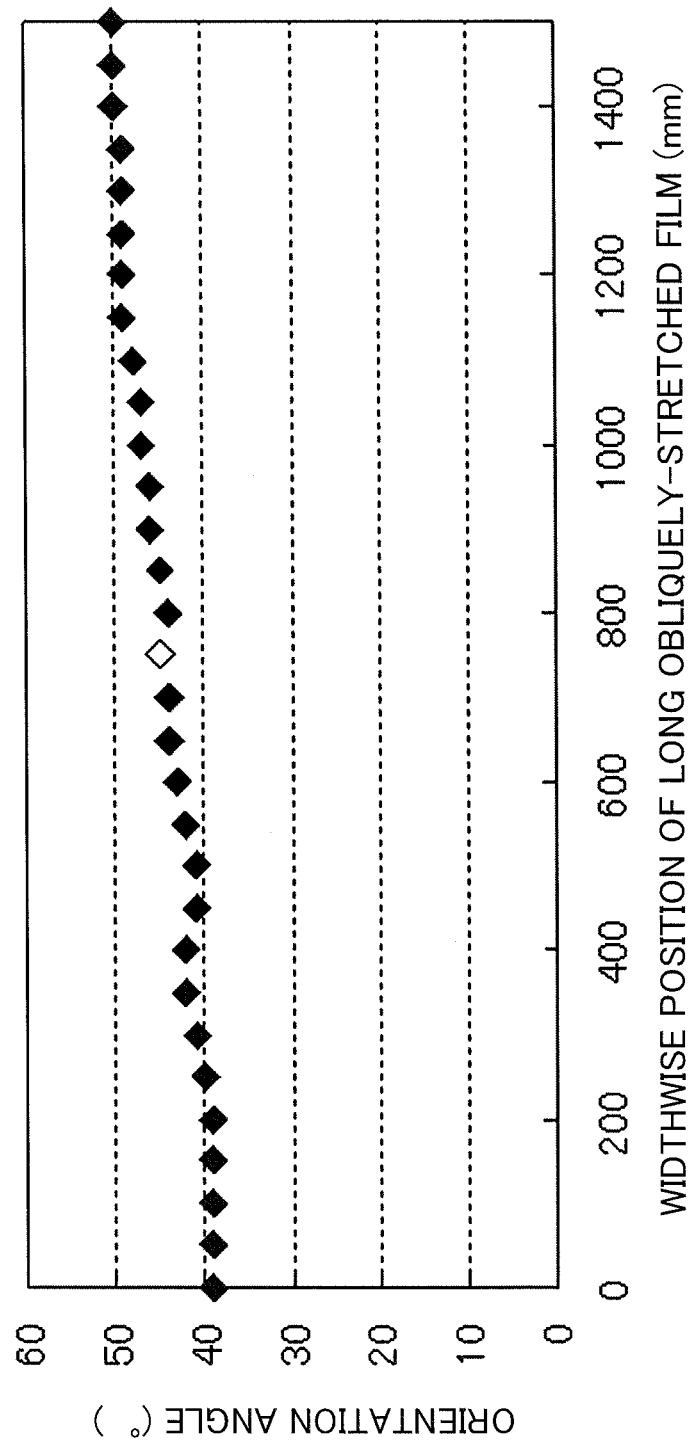
FIG. 9 is a graph presenting a distribution of the orientation angle in a widthwise direction of a long obliquely-stretched film.
Figure 10:
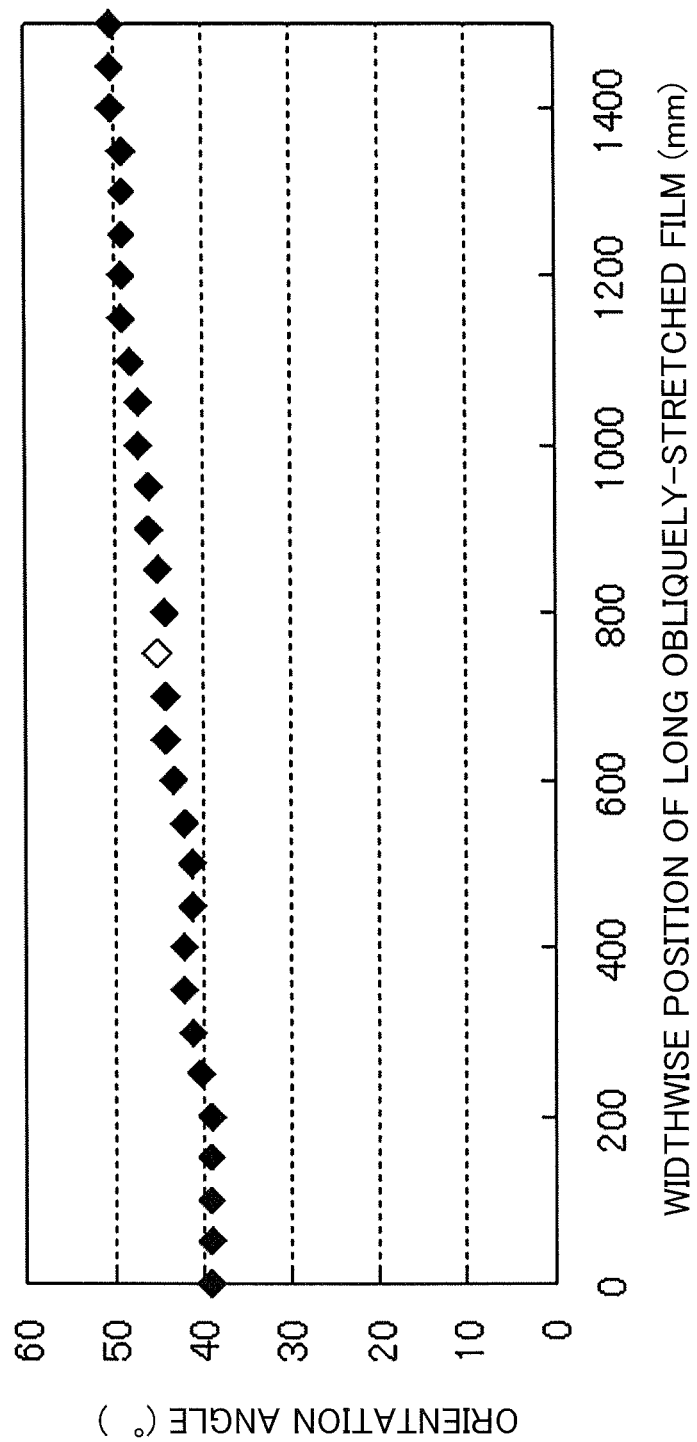
FIG. 10 is a graph presenting a distribution of the orientation angle in the widthwise direction of the long obliquely-stretched film.
Figure 11:
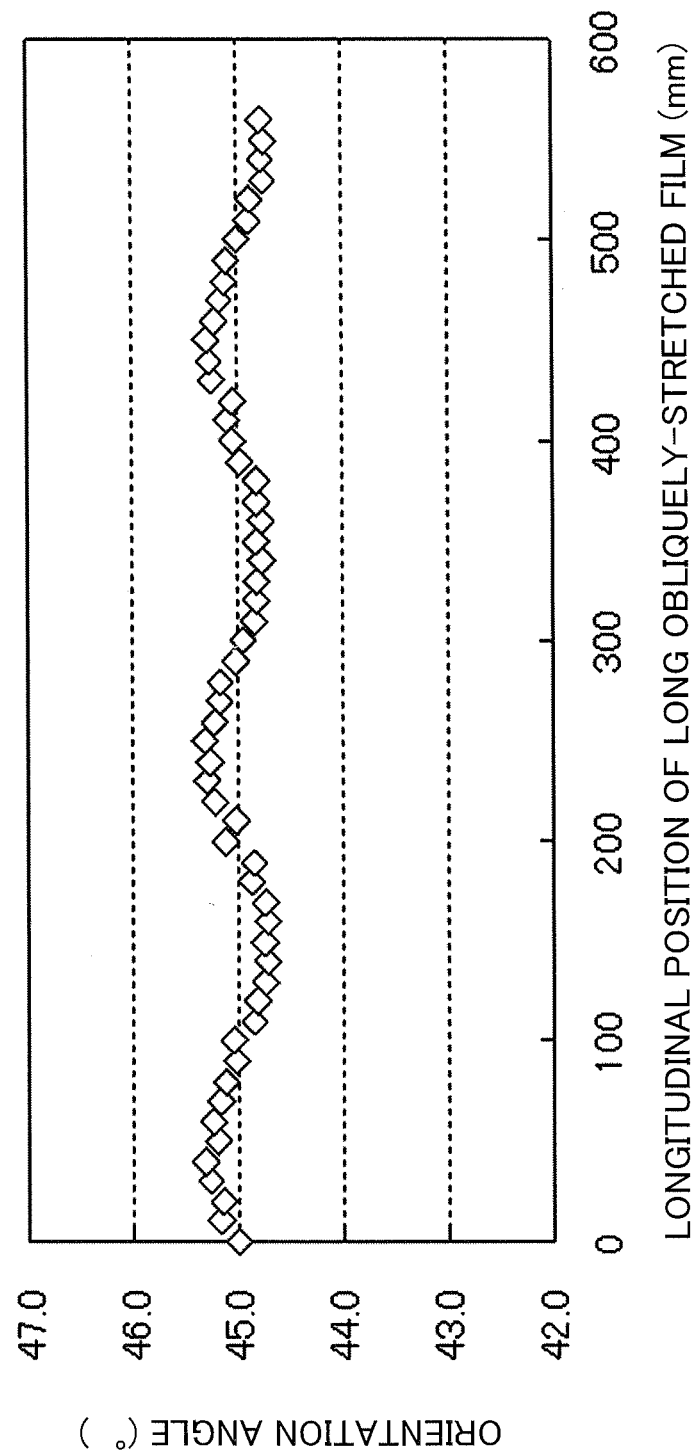
FIG. 11 is a graph presenting a distribution of the orientation angle in a longitudinal direction of the long obliquely-stretched film.

In the stretching zone, an infrared heater (ZKB 1000W/175G produced by Heraeus Holding GmbH) provided at a position away upwardly from a surface of the film by 100 mm was operated to be switched between ON and OFF states at intervals of 4 seconds, under an output power of 500 W, to obtain a long obliquely-stretched film The orientation angle on a line in a widthwise line at a certain longitudinal point of the obtained long obliquely-stretched film was measured in an aftermentioned manner. A result of the measurement was as presented in FIG. 9. FIG. 9 is a graph presenting a distribution of the orientation angle in the widthwise direction of the long obliquely-stretched film. Then, the orientation angle on a widthwise line at a point displaced from the above measurement point by 50 mm in the longitudinal direction was measured in the same manner as above. A result of the measurement was as presented in FIG. 10. FIG. 10 is a graph presenting a distribution of the orientation angle in the widthwise direction of the long obliquely-stretched film. The orientation angle on a widthwise line at each of a plurality of points away from the measurement point in FIG. 9 as a reference point by 10 mm, 20 mm, 30 mm, - - - , i.e., at intervals of 10 mm, in the longitudinal direction, was measured, and a value of the orientation angle at a center (the white mark in FIG. 9) of the widthwise line at each of the longitudinal points was extracted. As a result, the extracted orientation angles have a cyclical pattern in the longitudinal direction of the film, as illustrated in FIG. 11. FIG. 11 is a graph presenting a distribution of the orientation angle in the longitudinal direction of the long obliquely-stretched film.

In the long obliquely-stretched film, an amplitude of the extracted orientation angle (see FIG. 11) was 0.6°, a cycle length of a cyclical change of the extracted orientation angle was 200 mm, and a film thickness was 35 μm. Further, the long obliquely-stretched film had a haze of 0.8% and an internal haze of 0.3%.

The long obliquely-stretched film from the oblique stretching step was trimmed to have a widthwise length of 1500 mm. Then, using the winding apparatus provided at the exit, the trimmed film was wound into a roll shape in such a manner as to set a taking-up tension to 240 N/m and attain a winding length of 1000 m.

Subsequently, using the obtained long obliquely-stretched film, an organic EL display was produced in the following manner.

First of all, a 120 μm-thick polyvinyl alcohol film was subjected to uniaxial stretching (at a temperature: 110° C., stretching ratio: 5 times).

The stretched film was immersed in an aqueous solution comprising 0.075 g of iodine, 5 g of potassium iodide and 100 g of water, for 60 seconds, and then immersed in an aqueous solution comprising 6 g of potassium iodide, 7.5 g of boric acid and 100 g of water and having a temperature of 68° C. The dyed film was washed by water and dried to obtain a polarizer.

The long obliquely-stretched film produced in the above manner was laminated to one of opposite surfaces of the polarizer by using as a pressure sensitive adhesive an aqueous solution of 5% polyvinyl alcohol. In this process, they were laminated to allow an absorption axis of the polarizer and a slow axis of the λ/4 retardation film to be oriented to define an angle of 45° C. therebetween. Further, a Konica Minolta TAC film KC6UA (produced by Konica Minolta Advanced Layers, Inc.) was alkali-saponified and then laminated to the other side of the polarizer in the same manner as above to produce a circular polarizing plate.

An 80 nm-thick reflective electrode made of chromium was formed on a glass substrate by sputtering, and ITO (indium tin oxide) was formed as a positive electrode on reflective electrode by sputtering to have a thickness of 40 nm, whereafter poly(3,4-ethylenedioxythiophene)-polystyrenesulfonate (PEDOT:PSS) was formed as a hole transport layer on the positive electrode by sputtering to have a thickness of 80 nm, and each of three luminescent layers of RGB was formed on the hole transport layer by using a shadow mask to have a thickness of 100 nm.

As the red luminescent layer, tris(8-hydroxyquinolinato) aluminum ($Alq_3$) serving as a host and a luminescent compound [4-(dicyanomethylene)-2-methyl-6(p-dimethylaminostyryl)-4H-pyran] (DCM) were co-deposited (mass ratio: 99:1) to form a film having a thickness of 100 nm. As the green luminescent layer, $Alq_3$ serving as a host and a luminescent compound coumarin 6 were co-deposited (mass ratio: 99:1) to form a film having a thickness of 100 nm. As the blue luminescent layer, aftermentioned BAlq serving as a host and a luminescent compound perylene (mass ratio: 90:10) to form a film having a thickness of 100 nm.

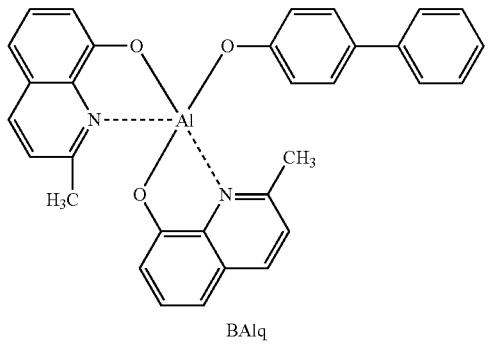

BAlq

Further, calcium was deposited on the luminescent layers by vacuum vapor deposition to form a film having a thickness of 4 nm and serving as a first negative electrode having a low work function enough to allow efficient injection of electrons, and aluminum was deposited on the first negative electrode by vacuum vapor deposition to form a film having a thickness of 2 nm and serving as a second negative electrode. The aluminum used as the second negative electrode has a role in preventing chemical alteration of calcium serving as the first negative electrode, during formation of an aftermentioned transparent electrode to be formed thereon by sputtering. In the above way, an organic luminescent layer was obtained. Subsequently, a transparent electrical conductive film was formed on the negative electrodes by sputtering, to have a thickness of 80 nm. As the transparent electrical conductive film, ITO was used. Further, boron nitride was deposited on the transparent electrical conductive film by CVD (chemical vapor deposition) to form an insulating film having a thickness of 200 nm.

The circular polarizing plate was fixed on the insulating film of the obtained organic electroluminescence display element in such a manner as to allow a surface of the λ/4 retardation film to face a surface of the insulating film to thereby produce an organic EL image display.

Inventive Example 2

Except that the power output of the infrared heater in the stretching zone was set to 200 W to allow the amplitude of the orientation angle to become 0.2°, a long obliquely-stretched film was produced in the same manner as that in Inventive Example 1. Further, an organic EL image display was produced in same manner as that in Inventive Example 1.

Inventive Example 3

Except that the power output of the infrared heater in the stretching zone was set to 800 W to allow the amplitude of the orientation angle to become 1.0°, a long obliquely-stretched film was produced in the same manner as that in Inventive Example 1. Further, an organic EL image display was produced in same manner as that in Inventive Example 1.

Comparative Example 1

Except that the power output of the infrared heater in the stretching zone was set to 70 W to allow the amplitude of the orientation angle to become 0.1°, a long obliquely-stretched film was produced in the same manner as that in Inventive Example 1. Further, an organic EL image display was produced in same manner as that in Inventive Example 1.

Comparative Example 2

Except that the power output of the infrared heater in the stretching zone was set to 1000 W to allow the amplitude of the orientation angle to become 1.2°, a long obliquely-stretched film was produced in the same manner as that in Inventive Example 1. Further, an organic EL image display was produced in same manner as that in Inventive Example 1.

Inventive Example 4

Except that the infrared heater in the stretching zone was operated in such a manner as to be switched between the ON and OFF states at intervals of 1 second, under an output power of 500 W, to thereby allow the cycle time of the orientation angle to become 15 mm, a long obliquely-stretched film was produced in the same manner as that in Inventive Example 1. Further, an organic EL image display was produced in same manner as that in Inventive Example 1.

Inventive Example 5

Except that the infrared heater in the stretching zone was operated in such a manner as to be switched between the ON and OFF states at intervals of 15 seconds, under an output power of 500 W, to thereby allow the cycle time of the orientation angle to become 1400 mm, a long obliquely-stretched film was produced in the same manner as that in Inventive Example 1. Further, an organic EL image display was produced in same manner as that in Inventive Example 1.

Comparative Example 3

Except that the infrared heater in the stretching zone was operated in such a manner as to be switched between the ON and OFF states at intervals of 0.5 second, under an output power of 500 W, to thereby allow the cycle time of the orientation angle to become 8 mm, a long obliquely-stretched film was produced in the same manner as that in Inventive Example 1. Further, an organic EL image display was produced in same manner as that in Inventive Example 1.

Comparative Example 4

Except that the infrared heater in the stretching zone was operated in such a manner as to be switched between the ON and OFF states at intervals of 17 second, under an output power of 500 W, to thereby allow the cycle time of the orientation angle to become 1500 mm, a long obliquely-stretched film was produced in the same manner as that in Inventive Example 1. Further, an organic EL image display was produced in same manner as that in Inventive Example 1.

Comparative Example 5

Except that the infrared heater in the stretching zone was operated in such a manner as to be switched between the ON and OFF states at random intervals ranging from 1 to 20 seconds, under an output power of 500 W, to thereby preclude the amplitude of the orientation angle from having a cyclical pattern, a long obliquely-stretched film was produced in the same manner as that in Inventive Example 1. Further, an organic EL image display was produced in same manner as that in Inventive Example 1.

Inventive Example 6

Except that the produced obliquely-stretched film was wound into a roll shape to attain a winding length of 2000 m, a long obliquely-stretched film was produced in the same manner as that in Inventive Example 1. Further, an organic EL image display was produced in same manner as that in Inventive Example 1.

Inventive Example 7

Except that the produced obliquely-stretched film was wound into a roll shape to attain a winding length of 3000 m, a long obliquely-stretched film was produced in the same manner as that in Inventive Example 1. Further, an organic EL image display was produced in same manner as that in Inventive Example 1.

Inventive Example 8

Except that the produced obliquely-stretched film was wound into a roll shape to attain a winding length of 4000 m, a long obliquely-stretched film was produced in the same manner as that in Inventive Example 1. Further, an organic EL image display was produced in same manner as that in Inventive Example 1.

Comparative Example 6

Except that the produced obliquely-stretched film was wound into a roll shape to attain a winding length of 2000 m, a long obliquely-stretched film was produced in the same manner as that in Comparative Example 1. Further, an organic EL image display was produced in same manner as that in Comparative Example 1.

Comparative Example 7

Except that the produced obliquely-stretched film was wound into a roll shape to attain a winding length of 3000 m, a long obliquely-stretched film was produced in the same manner as that in Comparative Example 1. Further, an organic EL image display was produced in same manner as that in Comparative Example 1.

Comparative Example 8

Except that the produced obliquely-stretched film was wound into a roll shape to attain a winding length of 4000 m, a long obliquely-stretched film was produced in the same manner as that in Comparative Example 1. Further, an organic EL image display was produced in same manner as that in Comparative Example 1.

Inventive Example 9

Except that as regards the temperature conditions of the tenter oven, the preheating zone, the stretching zone, the heat setting zone and the cooling zone were set to be maintained at temperatures of 195° C., 195° C., 193° C. and 100° C., respectively, and the stretching ratio in the stretching zone was adjusted to allow the film thickness to become 10 μm, a long obliquely-stretched film was produced in the same manner as that in Inventive Example 1. Further, an organic EL image display was produced in same manner as that in Inventive Example 1.

Inventive Example 10

Except that as regards the temperature conditions of the tenter oven, the preheating zone, the stretching zone, the heat setting zone and the cooling zone were set to be maintained at temperatures of 188° C., 188° C., 185° C. and 90° C., respectively, and the stretching ratio in the stretching zone was adjusted to allow the film thickness to become 80 μm, a long obliquely-stretched film was produced in the same manner as that in Inventive Example 1. Further, an organic EL image display was produced in same manner as that in Inventive Example 1.

Comparative Example 9

Except that as regards the temperature conditions of the tenter oven, the preheating zone, the stretching zone, the heat setting zone and the cooling zone were set to be maintained at temperatures of 195° C., 195° C., 193° C. and 100° C., respectively, and the stretching ratio in the stretching zone was adjusted to allow the amplitude of the orientation angle to become 0.1°, and allow the film thickness to become 10 μm, a long obliquely-stretched film was produced in the same manner as that in Comparative Example 1. Further, an organic EL image display was produced in same manner as that in Comparative Example 1.

Comparative Example 10

Except that as regards the temperature conditions of the tenter oven, the preheating zone, the stretching zone, the heat setting zone and the cooling zone were set to be maintained at temperatures of 188° C., 188° C., 185° C. and 90° C., respectively, and the stretching ratio in the stretching zone was adjusted to allow the amplitude of the orientation angle to become 0.1°, and allow the film thickness to become 80 μm, a long obliquely-stretched film was produced in the same manner as that in Comparative Example 1. Further, an organic EL image display was produced in same manner as that in Comparative Example 1.

Inventive Example 11

Except that the produced obliquely-stretched film was trimmed to have a widthwise length of 500 mm, a long obliquely-stretched film was produced in the same manner as that in Inventive Example 1. Further, an organic EL image display was produced in same manner as that in Inventive Example 1.

Inventive Example 12

Except that the produced obliquely-stretched film was trimmed to have a widthwise length of 2200 mm, a long obliquely-stretched film was produced in the same manner as that in Inventive Example 1. Further, an organic EL image display was produced in same manner as that in Inventive Example 1.

Comparative Example 11

Except that the produced obliquely-stretched film was trimmed to have a widthwise length of 500 mm, a long obliquely-stretched film was produced in the same manner as that in Comparative Example 1. Further, an organic EL image display was produced in same manner as that in Comparative Example 1.

Comparative Example 12

Except that the produced obliquely-stretched film was trimmed to have a widthwise length of 2200 mm, a long obliquely-stretched film was produced in the same manner as that in Comparative Example 1. Further, an organic EL image display was produced in same manner as that in Comparative Example 1.

Inventive Example 13

Except that the long film B was used, a long obliquely-stretched film was produced in the same manner as that in Inventive Example 1. Further, an organic EL image display was produced in same manner as that in Inventive Example 1. In this case, the produced long obliquely-stretched film had a haze of 1.0% and an internal haze of 0.4%.

Inventive Example 14

Except that the long film C was used, a long obliquely-stretched film was produced in the same manner as that in Inventive Example 1. Further, an organic EL image display was produced in same manner as that in Inventive Example 1. In this case, the produced long obliquely-stretched film had a haze of 0.9% and an internal haze of 0.4%.

Comparative Example 13

Except that the long film B was used, a long obliquely-stretched film was produced in the same manner as that in Comparative Example 1. Further, an organic EL image display was produced in same manner as that in Comparative Example 1.

Comparative Example 14

Except that the long film C was used, a long obliquely-stretched film was produced in the same manner as that in Comparative Example 1. Further, an organic EL image display was produced in same manner as that in Comparative Example 1.

<Evaluation>

The obtained long obliquely-stretched films were evaluated as follows.

(Measurement of Thickness)

Using a contact type film thickness gauge produced by Mitutoyo Co., measurement was performed at intervals of 50 mm in the widthwise direction of each of the long obliquely-stretched films, and each of the average measurement values thereof were regarded as the film thickness.

<Measurement of Amplitude and Cycle Length of Orientation Angle>

The orientation angle of the produced long obliquely-stretched film at a widthwise center point was measured using KOBRA-WXK produced by Oji Scientific Instruments). As an evaluation method, the measurement was performed along a line in the widthwise direction (widthwise line) at a reference longitudinal point (0 mm point) of the long obliquely-stretched film, at intervals of 50 mm, and a measurement value at a widthwise center point was used as a representative value at the reference longitudinal point. Then, the measurement point was displaced in the longitudinal direction of the film by an arbitrary value ranging from 1 to 50 mm, and the measurement was performed in the same manner. A measurement value at a widthwise center point of a widthwise line at the longitudinal point displaced by the arbitrary value (1 to 50 mm point) was used as a representative value at the longitudinal point. In the same manner, data about the orientation angle was sequentially collected at respective longitudinal points corresponding to the arbitrary value ranging from 1 to 50 mm, so as to measure the amplitude and cycle length along the longitudinal direction.

(Change in Color Unevenness Before and after Storage)

The long obliquely-stretched film wound into a roll shape was stored in a room adjusted at 40° C. and 80% RH, for 120 hours. Then, each of the long obliquely-stretched films before and after the storage was laminated to a polarizing film in such a manner as to allow a direction of the orientation angle of the long obliquely-stretched film and a direction of the polarizer to define an angle of 45°, to produce a circularly polarizing plate. Subsequently, the produced circularly polarizing plate was laminated to a mirror, and a difference in visual condition therebetween was observed, and evaluated by the following Evaluation Criteria.

(Evaluation Criteria for Change in Color Unevenness Before and after Storage)

◎: No difference in hue therebetween was observed, and they were evaluated as equivalent to each other.

○: A slight difference in hue therebetween was observed at an ignorable level.

Δ: A difference in hue therebetween was observed at an unignorable level.

x: A significant difference in hue therebetween was observed.

Each of the obtained organic EL displays was subjected to the following evaluations.

(Hue of Display)

Color unevenness in the entire display screen in a black state in the produced organic EL display was visually evaluated by the following Evaluation Criteria.

(Evaluation Criteria for Hue of Display)

◎: No difference in hue was observed in each area in the produced organic EL display.

○: A difference in hue was observed in each area in the produced organic EL display at a practically acceptable level.

Δ: A difference in hue was observed in each area in the produced organic EL display at a practically unacceptable level.

x: A large difference in hue was observed in each area in the produced organic EL display at a practically unacceptable level.

Outlines and evaluation results of the long obliquely-stretched films and the organic EL displays are collectively presented in Tables 1 to 6.

TABLE 1

| | Long Film used | Longitudinal Length (Winding Length) (m) | Widthwise Length (mm) | Cycle Length of Cyclical Changes (mm) | Film Thickness (μm) | Amplitude (°) | Change in Color Unevenness before and after Storage | Hue of Display |
|---|---|---|---|---|---|---|---|---|
| Inventive Example 1 | A | 1000 | 1500 | 200 | 35 | 0.6 | ◎ | ◎ |

TABLE 1-continued

|  | Long Film used | Longitudinal Length (Winding Length) (m) | Widthwise Length (mm) | Cycle Length of Cyclical Changes (mm) | Film Thickness (μm) | Amplitude (°) | Change in Color Unevenness before and after Storage | Hue of Display |
| --- | --- | --- | --- | --- | --- | --- | --- | --- |
| Inventive Example 2 | A | 1000 | 1500 | 200 | 35 | 0.2 | ○ | ○ |
| Inventive Example 3 | A | 1000 | 1500 | 200 | 35 | 1.0 | ○ | ○ |
| Comparative Example 1 | A | 1000 | 1500 | 200 | 35 | 0.1 | Δ | Δ |
| Comparative Example 2 | A | 1000 | 1500 | 200 | 35 | 1.2 | Δ | Δ |

TABLE 2

|  | Long Film used | Longitudinal Length (Winding Length) (m) | Widthwise Length (mm) | Cycle Length of Cyclical Changes (mm) | Film Thickness (μm) | Amplitude (°) | Change in Color Unevenness before and after Storage | Hue of Display |
| --- | --- | --- | --- | --- | --- | --- | --- | --- |
| Inventive Example 4 | A | (Winding Length) (m) | 1500 | 15 | 35 | 0.6 | ○ | ○ |
| Inventive Example 1 | A | 1000 | 1500 | 200 | 35 | 0.6 | ◎ | ◎ |
| Inventive Example 5 | A | 1000 | 1500 | 1400 | 35 | 0.6 | ○ | ○ |
| Comparative Example 3 | A | 1000 | 1500 | 8 | 35 | 0.6 | Δ | Δ |
| Comparative Example 4 | A | 1000 | 1500 | 1500 | 35 | 0.6 | Δ | Δ |
| Comparative Example 5 | A | 1000 | 1500 | random | 35 | 0.6 | Δ | Δ |

TABLE 3

|  | Long Film used | Longitudinal Length (Winding Length) (m) | Widthwise Length (mm) | Cycle Length of Cyclical Changes (mm) | Film Thickness (μm) | Amplitude (°) | Change in Color Unevenness before and after Storage | Hue of Display |
| --- | --- | --- | --- | --- | --- | --- | --- | --- |
| Inventive Example 6 | A | 2000 | 1500 | 200 | 35 | 0.6 | ○ | ○ |
| Inventive Example 7 | A | 3000 | 1500 | 200 | 35 | 0.6 | ○ | ○ |
| Inventive Example 8 | A | 4000 | 1500 | 200 | 35 | 0.6 | ○ | ○ |
| Comparative Example 6 | A | 2000 | 1500 | 200 | 35 | 0.1 | Δ | Δ |
| Comparative Example 7 | A | 3000 | 1500 | 200 | 35 | 0.1 | Δ | Δ |
| Comparative Example 8 | A | 4000 | 1500 | 200 | 35 | 0.1 | Δ | Δ |

TABLE 4

|  | Long Film used | Longitudinal Length (Winding Length) (m) | Widthwise Length (mm) | Cycle Length of Cyclical Changes (mm) | Film Thickness (μm) | Amplitude (°) | Change in Color Unevenness before and after Storage | Hue of Display |
| --- | --- | --- | --- | --- | --- | --- | --- | --- |
| Inventive Example 9 | A | 1000 | 1500 | 200 | 10 | 0.6 | ○ | ○ |
| Inventive Example 1 | A | 1000 | 1500 | 200 | 35 | 0.6 | ◎ | ◎ |
| Inventive Example 10 | A | 1000 | 1500 | 200 | 80 | 0.6 | ○ | ○ |
| Comparative Example 9 | A | 1000 | 1500 | 200 | 10 | 0.1 | Δ | Δ |
| Comparative Example 1 | A | 1000 | 1500 | 200 | 35 | 0.1 | Δ | Δ |

TABLE 4-continued

| | Long Film used | Longitudinal Length (Winding Length) (m) | Widthwise Length (mm) | Cycle Length of Cyclical Changes (mm) | Film Thickness (μm) | Amplitude (°) | Change in Color Unevenness before and after Storage | Hue of Display |
|---|---|---|---|---|---|---|---|---|
| Comparative Example 10 | A | 1000 | 1500 | 200 | 80 | 0.1 | Δ | Δ |

TABLE 5

| | Long Film used | Longitudinal Length (Winding Length) (m) | Widthwise Length (mm) | Cycle Length of Cyclical Changes (mm) | Film Thickness (μm) | Amplitude (°) | Change in Color Unevenness before and after Storage | Hue of Display |
|---|---|---|---|---|---|---|---|---|
| Inventive Example 11 | A | 1000 | 500 | 200 | 35 | 0.6 | ○ | ○ |
| Inventive Example 1 | A | 1000 | 1500 | 200 | 35 | 0.6 | ⊚ | ⊚ |
| Inventive Example 12 | A | 1000 | 2200 | 200 | 35 | 0.6 | ○ | ○ |
| Comparative Example 11 | A | 1000 | 500 | 200 | 35 | 0.1 | Δ | Δ |
| Comparative Example 1 | A | 1000 | 1500 | 200 | 35 | 0.1 | Δ | Δ |
| Comparative Example 12 | A | 1000 | 2200 | 200 | 35 | 0.1 | Δ | Δ |

TABLE 6

| | Long Film used | Longitudinal Length (Winding Length) (m) | Widthwise Length (mm) | Cycle Length of Cyclical Changes (mm) | Film Thickness (μm) | Amplitude (°) | Change in Color Unevenness before and afrer Storage | Hue of Display |
|---|---|---|---|---|---|---|---|---|
| Inventive Example 1 | A | 1000 | 1500 | 200 | 35 | 0.6 | ⊚ | ⊚ |
| Inventive Example 13 | B | 1000 | 1500 | 200 | 35 | 0.6 | ○ | ○ |
| Inventive Example 14 | C | 1000 | 1500 | 200 | 35 | 0.6 | ○ | ○ |
| Comparative Example 1 | A | 1000 | 1500 | 200 | 35 | 0.1 | Δ | Δ |
| Comparative Example 13 | B | 1000 | 1500 | 200 | 35 | 0.1 | X | X |
| Comparative Example 14 | C | 1000 | 1500 | 200 | 35 | 0.1 | X | X |

As presented in Table 1, in the long obliquely-stretched films in Inventive Examples 1 to 3, wherein the amplitude in the longitudinal cycle length is in the range of 0.2° to 1.0°, a change in color unevenness before and after the storage was not observed at all or only slightly observed, as compared to those of Comparative Examples 1 and 2, wherein the amplitude in the longitudinal cycle length is out of the above range. In the organic EL displays produced using the long obliquely-stretched films in Inventive Examples 1 to 3, unlike those of Comparative Examples 1 and 2 a difference in hue in each area was not observed or observed at a practically acceptable level.

As presented in Table 2, in the long obliquely-stretched films in Inventive Examples 4, 1 and 5, wherein the cycle length of cyclical changes is in the range of 10 mm to less than 1500 mm, the change in color unevenness before and after the storage was not observed at all or only slightly observed, unlike those of Comparative Examples 3 to 5, wherein the cycle length of cyclical changes is out of the above range. In the organic EL displays produced using the long obliquely-stretched films in Inventive Examples 4, 1 and 5, unlike those of Comparative Examples 3 to 5 the difference in hue in each area was not observed or observed at a practically acceptable level.

As presented in Table 3, even when the longitudinal length is 2000 m or more, in the long obliquely-stretched films in Inventive Examples 6 to 8, the change in color unevenness before and after the storage was only slightly observed. Further, in the organic EL displays produced using the long obliquely-stretched films in Inventive Examples 6 to 8, the difference in hue in each area was observed at a practically acceptable level. Differently, in the long obliquely-stretched films in Comparative Examples 6 to 8, wherein the amplitude in the longitudinal cycle length is 0.1°, when the longitudinal length is 2000 m or more, the change in color unevenness before and after the storage was slightly observed, and, in the organic EL displays produced using the long obliquely-stretched films in Comparative Examples 6 to 8, the difference in hue in each area was observed.

As illustrated in Table 4, in the long obliquely-stretched films in Inventive Examples 9, 1 and 10, wherein the film thickness is in the range of 10 to 80 μm, the change in color unevenness before and after the storage was not observed at all or only slightly observed. In the organic EL displays produced using the long obliquely-stretched films in Inventive Examples 9, 1 and 10, a difference in hue in each area was not observed or observed at a practically acceptable level. Differently, in the long obliquely-stretched films in Comparative Examples 9, 1 and 10, irrespective of the film thickness, the change in color unevenness before and after the storage was slightly observed, and, in the organic EL displays produced using the long obliquely-stretched films in Comparative Examples 9, 1 and 10, the difference in hue in each area was observed.

As illustrated in Table 5, in the long obliquely-stretched films in Inventive Examples 11, 1 and 12, wherein these films are different from each other in terms of widthwise length, the change in color unevenness before and after the storage was not observed at all or only slightly observed. In the organic EL displays produced using the long obliquely-stretched films in Inventive Examples 11, 1 and 12, the difference in hue in each area was not observed or observed at a practically acceptable level. Differently, in the long obliquely-stretched films in Comparative Examples 11, 1 and 12, irrespective of the widthwise length, the change in color unevenness before and after the storage was slightly observed, and, in the organic EL displays produced using the long obliquely-stretched films in Comparative Examples 11, 1 and 12, the difference in hue in each area was observed.

As illustrated in Table 6, in the long obliquely-stretched films in Inventive Examples 1, 13 and 14, wherein these films are produced using different types of long films, the change in color unevenness before and after the storage was not observed at all or only slightly observed. In the organic EL displays produced using the long obliquely-stretched films in Inventive Examples 1, 13 and 14, the difference in hue in each area was not observed or observed at a practically acceptable level. Particularly, Inventive Example 1 using the long film A comprising a polycarbonate resin exhibited excellent effects. Differently, in the long obliquely-stretched films in Comparative Examples 1, 13 and 14, the change in color unevenness before and after the storage was slightly observed or significantly observer. In the organic EL displays produced using the long obliquely-stretched films in Comparative Examples 1, 13 and 14, the difference in hue in each area was observed or largely observed.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims:

The invention claimed is:
1. A long obliquely-stretched film wound into a roll shape, comprising a thermoplastic resin and having an orientation angle oriented in a direction inclined with respect to a widthwise direction thereof,
   wherein, in a longitudinal direction of the long obliquely-stretched film, an angle defined between the orientation angle and the widthwise direction has a longitudinal cycle length of 10 mm to less than 1500 mm, and
   wherein an amplitude of the angle is in the range of 0.2° to 1.0° in the longitudinal cycle length.
2. The long obliquely-stretched film as defined in claim 1, which has a longitudinal length of 1000 m or more.
3. The long obliquely-stretched film as defined in claim 1, which has a film thickness of 10 to 80 μm.
4. The long obliquely-stretched film as defined in claim 1, which has a widthwise length of 500 mm or more.
5. The long obliquely-stretched film as defined in claim 1, wherein a long film comprises a thermoplastic resin and has a photo-elastic coefficient of $1.0 \times 10^{-11}$ to $1.0 \times 10^{-10}$ ($Pa^{-1}$).
6. The long obliquely-stretched film as defined in claim 1, wherein the thermoplastic resin is a polycarbonate-based resin.
7. A circularly polarizing plate which is produced using the long obliquely-stretched film as defined in claim 1.
8. An organic EL display which is produced using the circularly polarizing plate as defined in claim 7.

* * * * *